United States Patent
Eroz et al.

(10) Patent No.: US 9,088,299 B2
(45) Date of Patent: Jul. 21, 2015

(54) METHOD AND APPARATUS FOR CONVOLUTIONAL CODING TO SUPPORT MULTIPLEXING IN A WIDEBAND COMMUNICATIONS SYSTEM

(71) Applicant: Hughes Network Systems, LLC, Germantown, MD (US)

(72) Inventors: Mustafa Eroz, Germantown, MD (US); Yezdi Antia, North Potomac, MD (US); Lin-Nan Lee, Potomac, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 85 days.

(21) Appl. No.: 13/860,960

(22) Filed: Apr. 11, 2013

(65) Prior Publication Data

US 2014/0115429 A1 Apr. 24, 2014

Related U.S. Application Data

(60) Provisional application No. 61/650,639, filed on May 23, 2012, provisional application No. 61/648,399, filed on May 17, 2012, provisional application No. 61/641,578, filed on May 2, 2012, provisional application No. 61/622,707, filed on Apr. 11, 2012.

(51) Int. Cl.
*H03M 13/03* (2006.01)
*H03M 13/00* (2006.01)
*H04L 1/00* (2006.01)

(52) U.S. Cl.
CPC ............. *H03M 13/005* (2013.01); *H04L 1/00* (2013.01); *H04L 1/0059* (2013.01)

(58) Field of Classification Search
CPC ..................................................... H04L 1/0069
USPC ................. 714/790, 514, 729, 3; 370/503
See application file for complete search history.

(56) References Cited

U.S. PATENT DOCUMENTS 4,398,291 A 8/1983 Hotta et al.
5,581,688 A * 12/1996 Jiang et al. ............... 714/3

(Continued)

FOREIGN PATENT DOCUMENTS

WO WO0010301 2/2000

OTHER PUBLICATIONS

EPO, "Extended European Search Report", EPO Application No. 14168480.3.

(Continued)

*Primary Examiner* — Fritz Alphonse
(74) *Attorney, Agent, or Firm* — Potomac Technology Law, LLC

(57) ABSTRACT

An approach for encoding a physical layer (PL) header of a PL data frame is provided. The PL header comprises sixteen information bits $u_i$, (i=0, 1, 2, . . . , 15), and the encoding is based on a convolutional code, whereby, for each information bit, five associated parity bits $p_{i,k}$, (k=0, 1, 2, 3, 4) are generated, resulting in 80 codebits. The resulting 80 codebits are punctured to form a (16,77) codeword ($c_0, c_1, c_2, \ldots, c_{76}$). The codebits of the (16,77) codeword are repeated to generate a (16,154) physical layer signaling codeword ($c_0, c_0, c_1, c_1, c_2, c_2, \ldots, c_{76}, c_{76}$) for transmission of the PL data frame over a channel of a communications network. Further, for each information bit, each of the associated five parity bits is generated based on a parity bit generator, as follows: $p_{i,k}=(u_i*g_{k,0}) \oplus (S_0*g_{k,1}) \oplus (S_1*g_{k,2}) \oplus (S_2*g_{k,3}) \oplus (S_3*g_{k,4})$, where $S_0=u_{i-1}, S_1=u_{i-2}, S_2=u_{i-3}, S_3=u_{i-4}$, and wherein generator polynomials for $g_k=(g_{k,0}, g_{k,1}, g_{k,2}, g_{k,3}, g_{k,4})$, are as follows: $g_0=(1, 0, 1, 0, 1); g_1=(1, 0, 1, 1, 1); g_2=(1, 1, 0, 1, 1); g_3=(1, 1, 1, 1, 1); g_4=(1, 1, 0, 0, 1)$.

22 Claims, 12 Drawing Sheets

(56) References Cited

U.S. PATENT DOCUMENTS

| | | | |
|---|---|---|---|
| 5,805,822 A * | 9/1998 | Long et al. | 709/232 |
| 6,522,665 B1 | 2/2003 | Suzuki et al. | |
| 7,706,315 B2 | 4/2010 | Vanderaar et al. | |
| 7,715,786 B2 | 5/2010 | Santoru et al. | |
| 8,208,499 B2 * | 6/2012 | Sun et al. | 370/514 |
| 2004/0252725 A1 * | 12/2004 | Sun et al. | 370/503 |
| 2007/0206638 A1 | 9/2007 | Santoru et al. | |
| 2007/0208884 A1 | 9/2007 | Vanderaar et al. | |
| 2009/0034654 A1 | 2/2009 | Inukai et al. | |
| 2009/0279475 A1 | 11/2009 | Vanderaar et al. | |
| 2010/0157931 A1 | 6/2010 | Vanderaar et al. | |

OTHER PUBLICATIONS

Hughes Network Systems, "Evolutionary DVB-S2 Proposal", DVB, XP017840344, Feb. 17, 2013.

Motorola, "Transport Block Size and MCS Signaling for E-UTRA", 3Gpp TSG RAN1 #51, Nov. 5, 2007.

Panasonic, "Transport Format Signaling and Padding Overhead", 3GPP TSG-RAN WG1 Meeting #50b, Oct. 8, 2007.

* cited by examiner

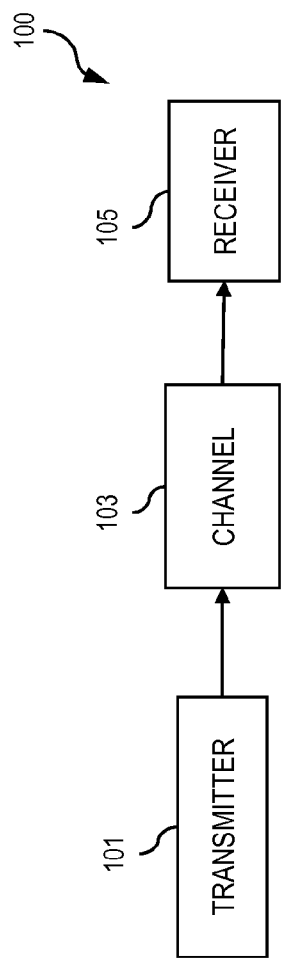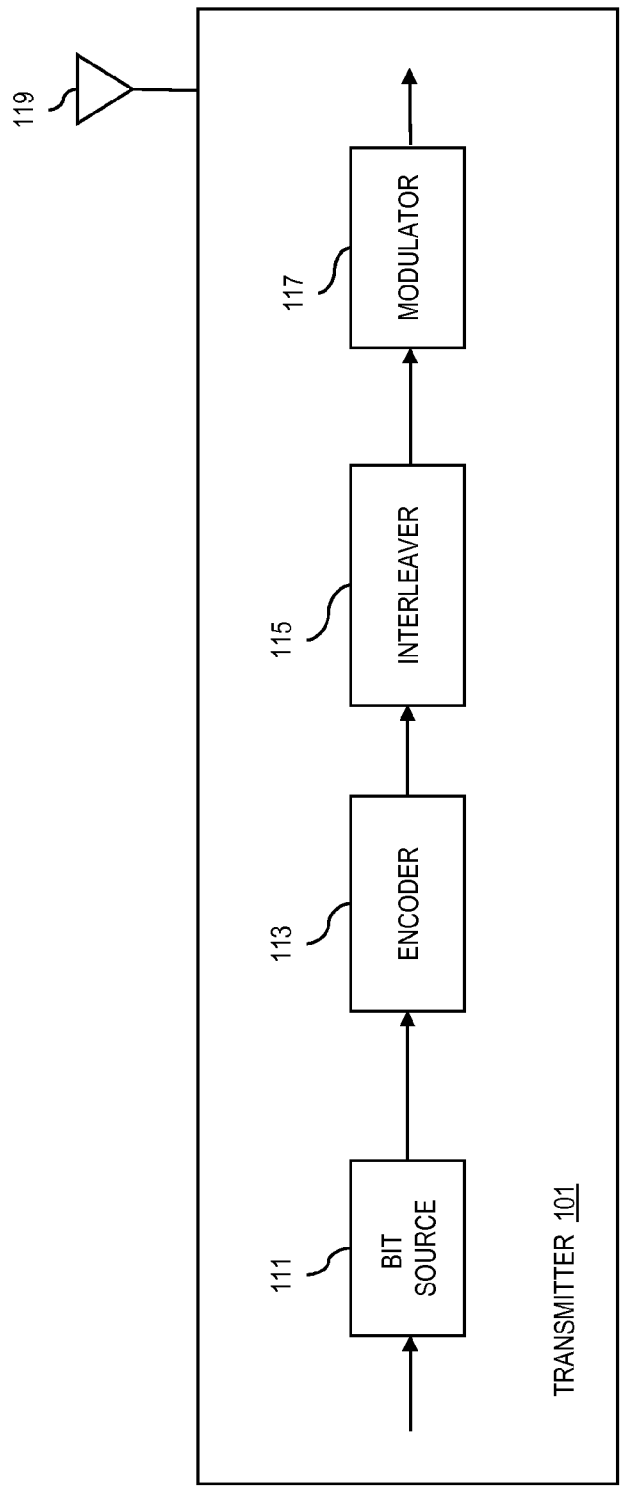

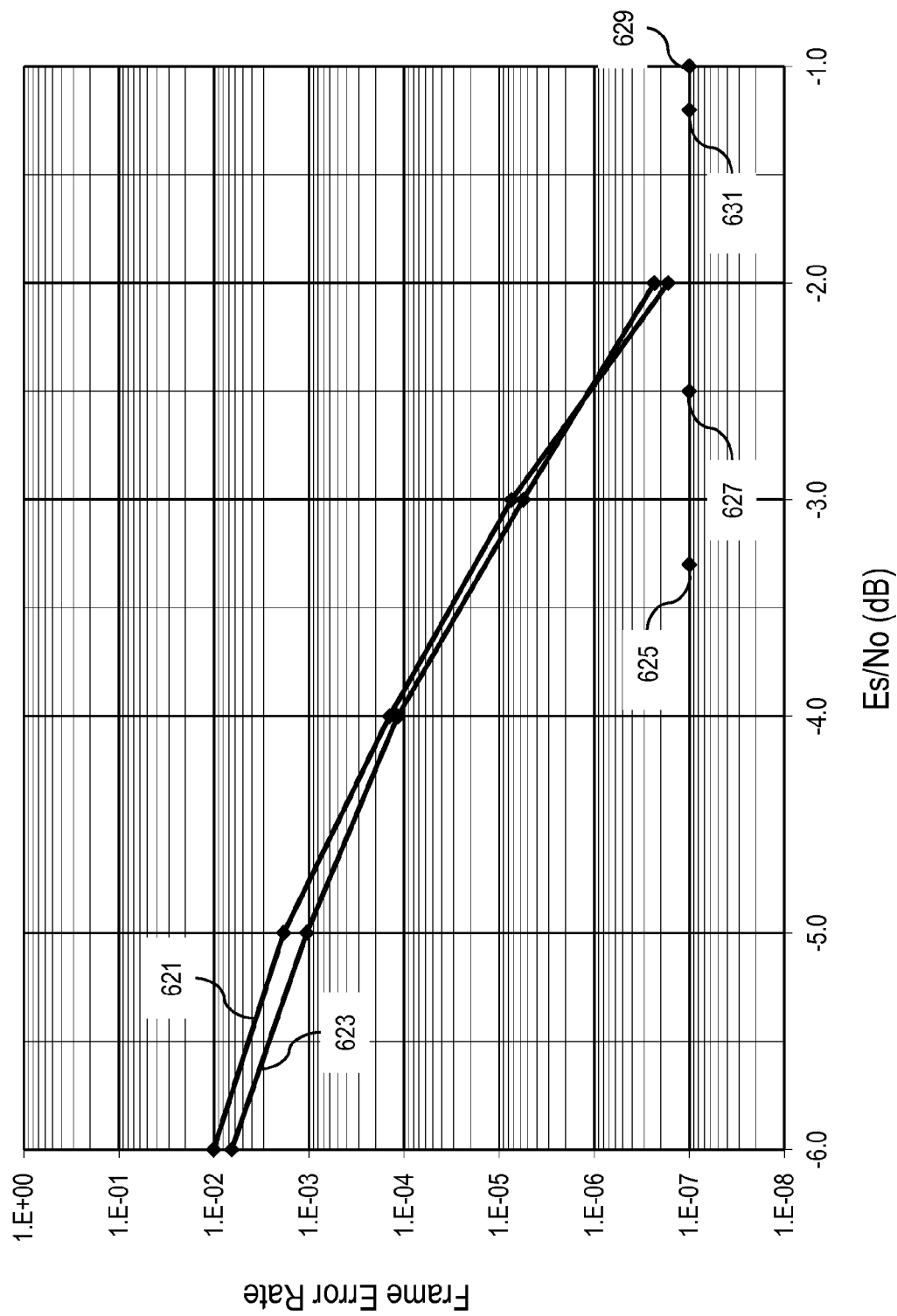

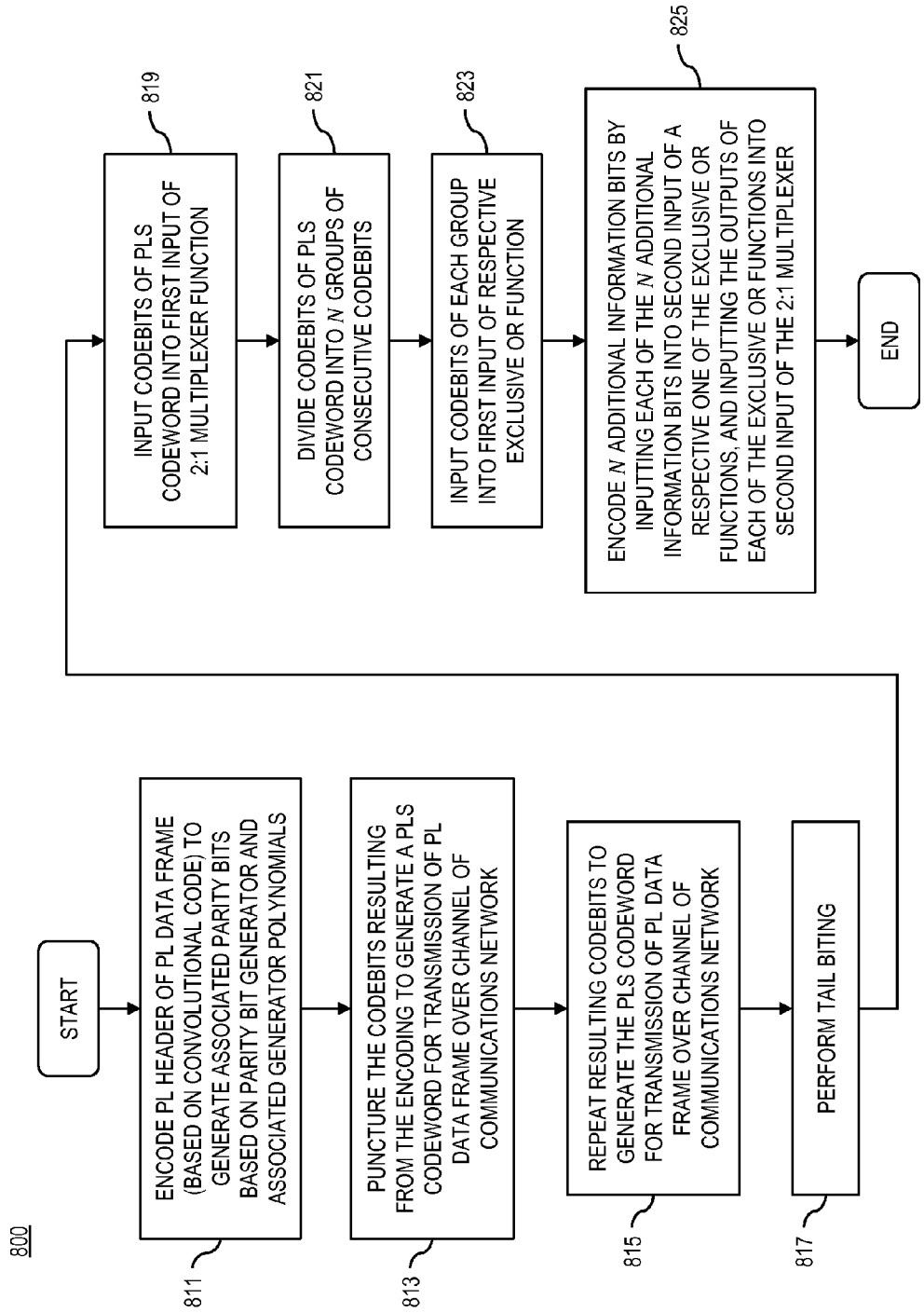

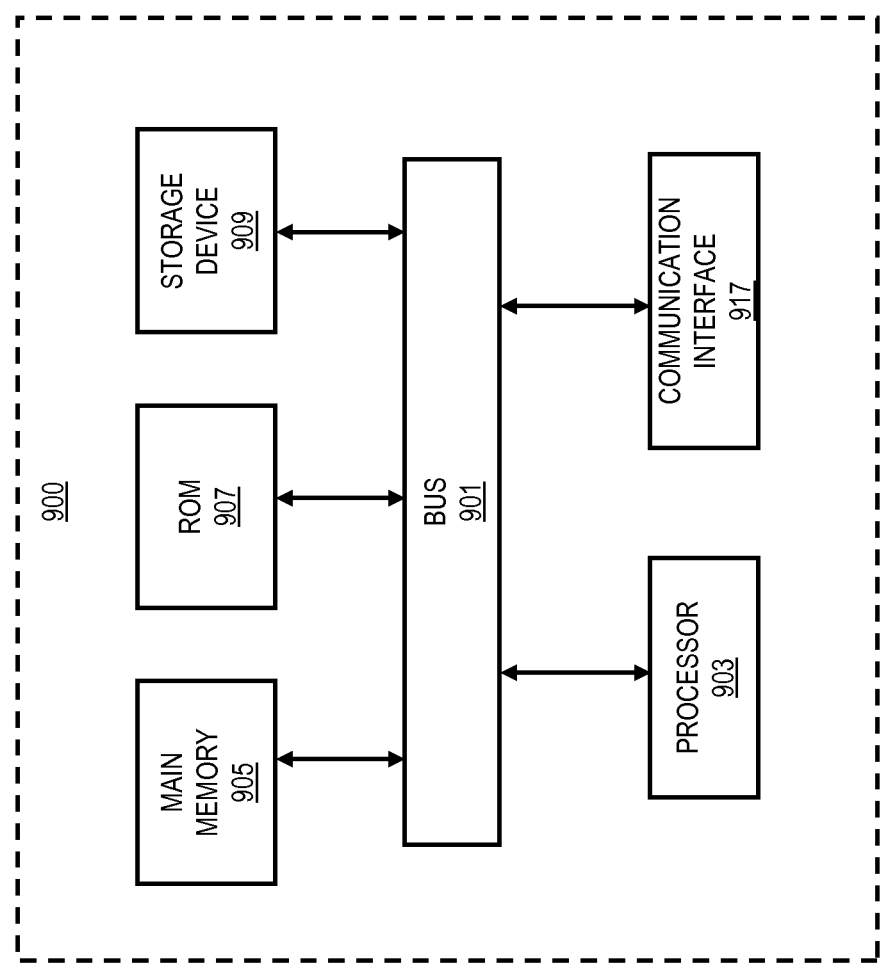

METHOD AND APPARATUS FOR CONVOLUTIONAL CODING TO SUPPORT MULTIPLEXING IN A WIDEBAND COMMUNICATIONS SYSTEM

RELATED APPLICATIONS

This application is related to and claims the benefit of priority under 35 U.S.C. §119(e) to U.S. Provisional Application Ser. No. 61/622,707 filed Apr. 11, 2012, U.S. Provisional Application Ser. No. 61/641,578 filed May 2, 2012, U.S. Provisional Application Ser. No. 61/648,399 filed May 17, 2012, and U.S. Provisional Application Ser. No. 61/650,639 filed May 23, 2012, the entirety of each of which is incorporated herein by reference.

FIELD OF THE INVENTION

The present invention relates to coding for wireless communication systems, and more particularly to convolutional coding for multiplexing within a wideband transponder of a communications system.

BACKGROUND OF THE INVENTION

Nearly all communications systems rely on some form of error control for managing errors that may occur due to noise and other factors during transmission of information through a wireless communication channel. Such communications systems can include satellite systems, fiber-optic systems, and cellular systems. Efficient error control schemes implemented at the transmitting end of these communications systems have the capacity to enable the transmission of data including audio, video, text, etc., with very low error rates within a given signal-to-noise ratio (SNR) environment. Powerful error control schemes also enable a communication system to achieve target error performance rates in environments with very low SNR, such as in satellite and other wireless systems, where noise is prevalent and high levels of transmission power are costly, if even feasible.

Accordingly, a broad class of powerful error control schemes have emerged, which enable reliable transmission of information including convolutional codes, low density parity check (LDPC) codes, and turbo codes. The current digital video broadcast DVB-S2 standard benefits from adaptive coding and modulation (ACM) for improving the bandwidth efficiency, and includes a physical layer signaling code (PLS Code), which yields PLS Codes in the header of the physical frame. DVB-S2 PLS Codes are encoded using (7,64) Reed-Muller codes. This current DVB-S2 PLS coding scheme, however, results in a PLS Code of a number of information bits that limits the information that can be conveyed by the code. While the current limits of the DVB-S2 PLS Code may be sufficient for the current DVB-S2 standard, the current DVB-S2 PLS Code lacks capabilities to support expansion for future systems and future generations of the DVB-S2 standard.

In current systems, outroutes are typically in the order of 30 to 45 Msps over which coded modulation data is sent. In next generation, high capacity satellite systems (e.g., systems of capacities exceeding 100 Gbps), however, bandwidth of outroutes are in the order of greater than 200 Msps (e.g., 220 Msps). While the current DVB-S2 standard may be applied to a 200 Msps outroute, such application raises a significant challenges in the development of relatively low complexity and low cost ASICs for the demodulation and decoding of such outroutes at the satellite terminals and gateways. In order to address such cost and complexity issues, multiplexing schemes may be employed to reduce the speed at which such ASICs are required to process received data streams, and to reduce complexity and power requirements (hence reducing the costs associated with the decoder ASICs). Such multiplexing schemes entail the multiplexing of a number of lower throughput outroute streams into one larger outroute transmission stream. Thus, because a particular terminal is not intended to consume the entire information bandwidth of the multiplexed stream, the multiplexing scheme allows the decoder to be run at a lower speed and provide the needed information bandwidth. In order to facilitate operation of the decoder at a lower speed, however, the packets of the transmission stream must be coded to permit identification of the packets of a data stream destined for a particular terminal without requiring the terminal to fully demodulate and decode every packet. The current DVB-S2 PLS coding scheme, however, lacks the capability to support such additional coding in the PLS Code, and thus additional layers of coding and decoding would be required.

What is needed, therefore, is a method and apparatus for convolutional coding for DVB-S2 PLS coding to provide an expanded PLS Code (e.g., to support multi-carrier multiplexing within a wideband transponder of a wireless communications system).

SUMMARY OF THE INVENTION

The present invention advantageously addresses the needs above, as well as other needs, by providing a method and apparatus for convolutional coding for DVB-S2 PLS coding, which provides an expanded PLS Code (e.g., to support multi-carrier multiplexing within a wideband transponder of a wireless communications system). According to an exemplary embodiment, a convolutional code (e.g., a (16,154) convolutional code) is employed for DVB-S2 PLS coding, which results in an extended PLS Code that can support signaling of stream identification (SID) for packets of multiplexed data stream of a wideband communications system. According to a further exemplary embodiment, a convolutional code is employed for DVB-S2 PLS coding, which increases the MODCOD by one bit to allow for new modulation and coding for next generation DVB-S2 standards. Moreover, according to exemplary embodiments, such enhanced PLS coding improves the coding performance, which facilitates operation with the most robust modulation and coding, such as QPSK, rate 1/4, short modulation and coding.

According to an example embodiment, a method comprises encoding, by a processor of a device, a physical layer (PL) header of a PL data frame, wherein the PL header comprises sixteen information bits $u_i$, (i=0, 1, 2, ..., 15), and the encoding is based on a convolutional code, whereby, for each information bit $u_i$, (i=0, 1, 2, ..., 15), ten associated parity bits $p_{i,k}$, (k=0, 1, 2, ..., 9) are generated, resulting in 160 codebits. The method further comprises puncturing the resulting 160 codebits to form a (16,154) physical layer signaling (PLS) codeword for transmission of the PL data frame over a channel of a communications network. For each information bit $u_i$, (i=0, 1, 2, ..., 15), each of the associated ten parity bits $p_{i,k}$, (k=0, 1, 2, ..., 9) is generated based on a parity bit generator, as follows: $p_{i,k} = (u_i * g_{k,0}) \oplus (S_0 * g_{k,1}) \oplus (S_1 * g_{k,2}) \oplus (S_2 * g_{k,3}) \oplus (S_3 * g_{k,4})$, where $S_0 = u_{i-1}$, $S_1 = u_{i-2}$, $S_2 = u_{i-3}$, $S_3 = u_{i-4}$, and generator polynomials for $g_k = (g_{k,0}, g_{k,1}, g_{k,2}, g_{k,3}, g_{k,4})$, are as follows: $g_0 = (1, 1, 1, 1, 1)$, $g_1 = (1, 0, 1, 1, 1)$, $g_2 = (1, 1, 0, 0, 1)$, $g_3 = (1, 1, 0, 1, 1)$, $g_4 = (1, 1, 1, 0, 1)$, $g_5 = (1, 1, 0, 1, 1)$, $g_6 = (1, 0, 1, 1, 1)$, $g_7 = (1, 0, 1, 0, 1)$, $g_8 = (1, 0, 0, 1, 1)$, $g_9 = (1, 0, 0, 0, 1)$.

According to a further example, the puncturing of the resulting 160 codebits comprises puncturing the parity bits $p_{0,9}$, $p_{3,9}$, $p_{6,9}$, $p_{9,9}$, $p_{12,9}$, $p_{15,9}$ (the tenth parity bit for each of the information bits $u_0$, $u_3$, $u_6$, $u_9$, $u_{12}$, $u_{15}$). According to another example, the method further comprises performing tail biting, wherein initial states for $S_0$, $S_1$, $S_2$, $S_3$ are set as $S_0=u_{15}$, $S_1=u_{14}$, $S_2=u_{13}$, $S_3=u_{12}$, and no tail bits are transmitted.

According to a further example embodiment, a method comprises encoding, by a processor of a device, a physical layer (PL) header of a PL data frame, wherein the PL header comprises eight information bits $u_i$, (i=0, 1, 2, ..., 7), and the encoding is based on a convolutional code, whereby, for each information bit $u_i$, (i=0, 1, 2, ..., 7), ten associated parity bits $p_{i,k}$, (k=0, 1, 2, ..., 9) are generated, resulting in 80 codebits. The method further comprises puncturing the resulting 80 codebits to form an (8,64) physical layer signaling (PLS) codeword for transmission of the PL data frame over a channel of a communications network. For each information bit $u_i$, (i=0, 1, 2, ..., 7), each of the associated ten parity bits $p_{i,k}$, (k=0, 1, 2, ..., 9) is generated based on a parity bit generator, as follows: $p_{i,k}=(u_i*g_{k,0})\oplus(u_{i-1}*g_{k,1})\oplus(u_{i-2}*g_{k,2})\oplus(u_{i-3}*g_{k,3})\oplus(u_{i-4}*g_{k,4})$, wherein generator polynomials for $g_k=(g_{k,0}, g_{k,1}, g_{k,2}, g_{k,3}, g_{k,4})$, are as follows: $g_0=(1, 1, 1, 1, 1)$, $g_1=(1, 0, 1, 1, 1)$, $g_2=(1, 1, 0, 0, 1)$, $g_3=(1, 1, 0, 1, 1)$, $g_4=(1, 1, 1, 0, 1)$, $g_5=(1, 1, 0, 1, 1)$, $g_6=(1, 0, 1, 1, 1)$, $g_7=(1, 0, 1, 0, 1)$, $g_8=(1, 0, 0, 1, 1)$, $g_9=(1, 0, 0, 0, 1)$. According to a further example, the puncturing of the resulting 80 codebits comprises puncturing the parity bits $p_{0,5}$, $p_{0,6}$, $p_{1,5}$, $p_{1,6}$, $p_{2,5}$, $p_{2,6}$, $p_{3,5}$, $p_{3,6}$, $p_{4,5}$, $p_{4,6}$, $p_{5,5}$, $p_{5,6}$, $p_{6,5}$, $p_{6,6}$, $p_{7,5}$, $p_{7,6}$ (the fourth and fifth parity bits for each of the information bits $u_0$, $u_1$, $u_2$, ..., $u_7$).

According to a further example embodiment, a method comprises encoding, by a processor of a device, a physical layer (PL) header of a PL data frame, wherein the PL header comprises sixteen information bits $u_i$, (i=0, 1, 2, ..., 15), and the encoding is based on a convolutional code, whereby, for each information bit $u_i$, (i=0, 1, 2, ..., 15), five associated parity bits $p_{i,k}$, (k=0, 1, 2, 3, 4) are generated, resulting in 80 codebits. The method further comprises puncturing the resulting 80 codebits to form a (16,77) codeword of 77 codebits ($c_0$, $c_1$, $c_2$, ..., $c_{76}$), and repeating the codebits of the (16,77) codeword to generate a (16,154) physical layer signaling (PLS) codeword ($c_0$, $c_0$, $c_1$, $c_1$, $c_2$, $c_2$, ..., $c_{76}$, $c_{76}$) for transmission of the PL data frame over a channel of a communications network. For each information bit $u_i$, (i=0, 1, 2, ..., 15), each of the associated five parity bits $p_{i,k}$, (k=0, 1, 2, 3, 4) is generated based on a parity bit generator, as follows: $p_{i,k}=(u_i*g_{k,0})\oplus(S_0*g_{k,1})\oplus(S_1*g_{k,2})\oplus(S_2*g_{k,3})\oplus(S_3*g_{k,4})$, where $S_0=u_{i-1}$, $S_1=u_{i-2}$, $S_2=u_{i-3}$, $S_3=u_{i-4}$, and wherein generator polynomials for $g_k=(g_{k,0}, g_{k,1}, g_{k,2}, g_{k,3}, g_{k,4})$, are as follows: $g_0=(1, 0, 1, 0, 1)$, $g_1=(1, 0, 1, 1, 1)$, $g_2=(1, 1, 0, 1, 1)$, $g_3=(1, 1, 1, 1, 1)$, $g_4=(1, 1, 0, 0, 1)$. According to a further example, the puncturing of the resulting 80 codebits comprises puncturing the parity bits $p_{3,4}$, $p_{8,4}$, $p_{13,4}$ (the third parity bit for each of the information bits $u_3$, $u_8$, $u_{13}$). According to yet a further example, the repetition of the codebits of the (16,77) codeword comprises inputting the (16,77) codeword into a first input of a 2:1 multiplexer function, dividing the (16,77) codeword into N groups of consecutive codebits, each group being of an integer number of codebits approximately equal to 77/N, inputting the codebits of each group into a first input of a respective Exclusive OR function, and encoding N additional information bits to generate a (16+N, 154) physical layer signaling (PLS) codeword for transmission of the PL data frame over a channel of a communications network. The encoding of the N additional information bits comprises inputting each of the N additional information bits into a second input of a respective one of the Exclusive OR functions, and inputting the outputs of each of the Exclusive OR functions into a second input of the 2:1 multiplexer, wherein, as the 2:1 multiplexer cycles through the insertion of the repeated bits, it switches through the bit group feeds from the Exclusive-OR functions, and each group of codebits from the (16,77) codeword is repeated as is or repeated as an inverse, depending on the value of the additional information bit fed into the respective Exclusive-OR function.

According to a further example embodiment, an apparatus comprises an encoder configured to encode a physical layer (PL) header of a PL data frame, wherein the PL header comprises sixteen information bits $u_i$, (i=0, 1, 2, ..., 15), and the encoding is based on a convolutional code, whereby, for each information bit $u_i$, (i=0, 1, 2, ..., 15), ten associated parity bits $p_{i,k}$, (k=0, 1, 2, ..., 9) are generated, resulting in 160 codebits. The apparatus further comprises a puncturing module configured to puncture the resulting 160 codebits to form a (16, 154) physical layer signaling (PLS) codeword for transmission of the PL data frame over a channel of a communications network. The apparatus further comprises a parity bit generator configured to generate, for each information bit $u_i$, (i=0, 1, 2, ..., 15), ten associated parity bits $p_{i,k}$, (k=0, 1, 2, ..., 9), as follows: $p_{i,k}=(u_i*g_{k,0})\oplus(S_0*g_{k,1})\oplus(S_1*g_{k,2})\oplus(S_2*g_{k,3})\oplus(S_3*g_{k,4})$, where $S_0=u_{i-1}$, $S_1=u_{i-2}$, $S_2=u_{i-3}$, $S_3=u_{i-4}$, and wherein generator polynomials for $g_k=(g_{k,0}, g_{k,1}, g_{k,2}, g_{k,3}, g_{k,4})$, are as follows: $g_0=(1, 1, 1, 1, 1)$, $g_1=(1, 0, 1, 1, 1)$, $g_2=(1, 1, 0, 0, 1)$, $g_3=(1, 1, 0, 1, 1)$, $g_4=(1, 1, 1, 0, 1)$, $g_5=(1, 1, 0, 1, 1)$, $g_6=(1, 0, 1, 1, 1)$, $g_7=(1, 0, 1, 0, 1)$, $g_8=(1, 0, 0, 1, 1)$, $g_9=(1, 0, 0, 0, 1)$. According to a further example, the puncturing of the resulting 160 codebits comprises puncturing the parity bits $p_{0,9}$, $p_{3,9}$, $p_{6,9}$, $p_{9,9}$, $p_{12,9}$, $p_{15,9}$ (the tenth parity bit for each of the information bits $u_0$, $u_3$, $u_6$, $u_9$, $u_{12}$, $u_{15}$). According to another example, the puncturing module is further configured to perform tail biting, wherein initial states for $S_0$, $S_1$, $S_2$, $S_3$ are set as $S_0=u_{15}$, $S_1=u_{14}$, $S_2=u_{13}$, $S_3=u_{12}$, and no tail bits are transmitted.

According to a further example embodiment, an apparatus comprises an encoder configured to encode a physical layer (PL) header of a PL data frame, wherein the PL header comprises eight information bits $u_i$, (i=0, 1, 2, ..., 7), and the encoding is based on a convolutional code, whereby, for each information bit $u_i$, (i=0, 1, 2, ..., 7), ten associated parity bits $p_{i,k}$, (k=0, 1, 2, ..., 9) are generated, resulting in 80 codebits. The apparatus further comprises a puncturing module configured to puncture the resulting 80 codebits to form an (8,64) physical layer signaling (PLS) codeword for transmission of the PL data frame over a channel of a communications network. The apparatus further comprises a parity bit generator configured to generate, for each information bit $u_i$, (i=0, 1, 2, ..., 7), ten associated parity bits $p_{i,k}$, (k=0, 1, 2, ..., 9), as follows: $p_{i,k}=(u_i*g_{k,0})\oplus(u_{i-1}*g_{k,1})\oplus(u_{i-2}*g_{k,2})\oplus(u_{i-3}*g_{k,3})\oplus(u_{i-4}*g_{k,4})$, wherein generator polynomials for $g_k=(g_{k,0}, g_{k,1}, g_{k,2}, g_{k,3}, g_{k,4})$, are as follows: $g_0=(1, 1, 1, 1, 1)$, $g_1=(1, 0, 1, 1, 1)$, $g_2=(1, 1, 0, 0, 1)$, $g_3=(1, 1, 0, 1, 1)$, $g_4=(1, 1, 1, 0, 1)$, $g_5=(1, 1, 0, 1, 1)$, $g_6=(1, 0, 1, 1, 1)$, $g_7=(1, 0, 1, 0, 1)$, $g_8=(1, 0, 0, 1, 1)$, $g_9=(1, 0, 0, 0, 1)$. According to a further example, the puncturing of the resulting 80 codebits comprises puncturing the parity bits $p_{0,5}$, $p_{0,6}$, $p_{1,5}$, $p_{1,6}$, $p_{2,5}$, $p_{2,6}$, $p_{3,5}$, $p_{3,6}$, $p_{4,5}$, $p_{4,6}$, $p_{5,5}$, $p_{5,6}$, $p_{6,5}$, $p_{6,6}$, $p_{7,5}$, $p_{7,6}$ (the fourth and fifth parity bits for each of the information bits $u_0$, $u_1$, $u_2$, ..., $u_7$).

According to a further example embodiment, an apparatus comprises an encoder configured to encode a physical layer (PL) header of a PL data frame, wherein the PL header comprises sixteen information bits $u_i$, (i=0, 1, 2, ..., 15), and the encoding is based on a convolutional code, whereby, for each information bit $u_i$, (i=0, 1, 2, ..., 15), five associated parity bits $p_{i,k}$, (k=0, 1, 2, 3, 4) are generated, resulting in 80 codebits. The apparatus further comprises a puncturing module configured to puncture the resulting 80 codebits to form a (16,77) codeword of 77 codebits ($c_0, c_1, c_2, \ldots, c_{76}$). The apparatus further comprises a repeater module configured to repeat the codebits of the (16,77) codeword to generate a (16,154) physical layer signaling (PLS) codeword ($c_0, c_0, c_1, c_1, c_2, c_2, \ldots, c_{76}, c_{76}$) for transmission of the PL data frame over a channel of a communications network. The apparatus further comprises a parity bit generator configured to generate, for each information bit $u_i$, ($i=0, 1, 2, \ldots, 15$), five associated parity bits $p_{i,k}$, ($k=0, 1, 2, 3, 4$), as follows: $p_{i,k}=(u_i*g_{k,0})\oplus(S_0*g_{k,1})\oplus(S_1*g_{k,2})\oplus(S_2*g_{k,3})\oplus(S_3*g_{k,4})$, where $S_0=u_{i-1}$, $S_1=u_{i-2}$, $S_2=u_{i-3}$, $S_3=u_{i-4}$, and wherein generator polynomials for $g_k=(g_{k,0}, g_{k,1}, g_{k,2}, g_{k,3}, g_{k,4})$, are as follows: $g_0=(1, 0, 1, 0, 1)$, $g_1=(1, 0, 1, 1, 1)$, $g_2=(1, 1, 0, 1, 1)$, $g_3=(1, 1, 1, 1, 1)$, $g_4=(1, 1, 0, 0, 1)$. According to a further example, the puncturing of the resulting 80 codebits comprises puncturing the parity bits $p_{3,4}, p_{8,4}, p_{13,4}$ (the third parity bit for each of the information bits $u_3, u_8, u_{13}$). According to another example, the apparatus further comprises a 2:1 multiplexer with a first input comprising the (16,77) codeword, and N Exclusive OR components with a first input of each of the N Exclusive OR components being a respective one of N groups of consecutive codebits of the (16,77) codeword, each group being of an integer number of codebits approximately equal to 77/N. The repetition of the codebits of the (16,77) codeword comprises encoding N additional information bits to generate a (16+N, 154) physical layer signaling (PLS) codeword for transmission of the PL data frame over a channel of a communications network. The encoding of the N additional information bits comprises inputting each of the N additional information bits into a second input of a respective one of the Exclusive OR components, and inputting the outputs of each of the Exclusive OR components into a second input of the 2:1 multiplexer. As the 2:1 multiplexer cycles through the insertion of the repeated bits, it switches through the bit group feeds from the Exclusive-OR components, and each group of codebits from the (16,77) codeword is repeated as is or repeated as an inverse, depending on the value of the additional information bit fed into the respective Exclusive-OR component.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1A illustrates a communications system capable of employing convolutional coding, in accordance with exemplary embodiments;

FIG. 1B illustrates a block diagram of an exemplary transmitter of the digital communications system of FIG. 1A, in accordance with an exemplary embodiment;

FIG. 6B illustrates performance curves of the Frame Error Rate versus the Es/No for an (8,64) convolutional code (in accordance with an exemplary embodiment), as compared to the performance curve for a traditional (8,64) Reed-Muller code, along with the rate 1/4 short spec point, the rate 1/4 normal spec point, the rate 1/3 short spec point and the rate 1/3 normal spec point;

FIG. 8 illustrates a flow chart depicting a processes for encoding physical layer (PL) headers of a PL data frames to generate physical layer signaling (PLS) codewords for transmitting the PL data frames over a channel of a communications network, in accordance with exemplary embodiments;

FIG. 9 is a diagram of a computer system, in accordance with exemplary embodiments.

DETAILED DESCRIPTION OF PREFERRED EMBODIMENTS

Figure 2:
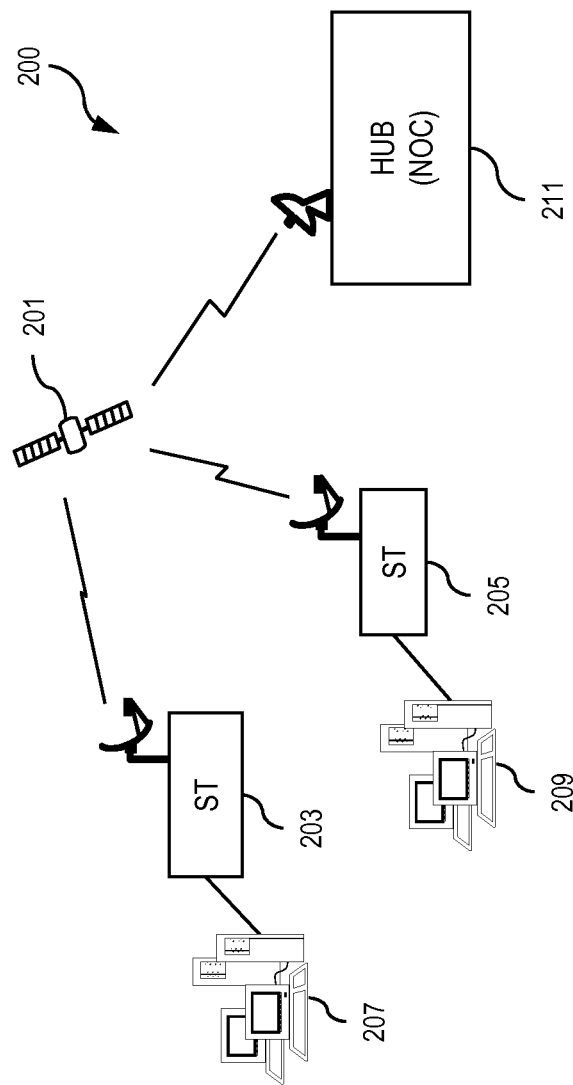
FIG. 2 illustrates a satellite communications system capable of employing convolutional coding, in accordance with exemplary embodiments.

A method and apparatus for convolutional coding for DVB-S2 PLS coding, which provides an expanded PLS Code (e.g., to support multi-carrier multiplexing within a wideband transponder of a wireless communications system), is described. In the following description, for the purposes of explanation, numerous specific details are set forth in order to provide a thorough understanding of the invention. It is apparent, however, that the invention may be practiced without these specific details or with an equivalent arrangement. In other instances, well known structures and devices are shown in block diagram form in order to avoid unnecessarily obscuring the invention.

FIG. 1A illustrates a communications system 100 capable of employing convolutional coding for DVB-S2 PLS coding according to various exemplary embodiments. With reference to FIG. 1, a digital communications system 100 includes one or more transmitters 101 (of which one is shown) that generate signal waveforms across a communication channel 103 to one or more receivers 105 (of which one is shown). In this discrete communications system 100, the transmitter 101 has a signal source that produces a discrete set of data signals, where each of the data signals has a corresponding signal waveform. These signal waveforms are attenuated, or otherwise altered, by communications channel 103. To combat noise and other issues associated with the channel 103, coding may be utilized. For example, forward error correction (FEC) codes can be employed.

FIG. 1B illustrates a block diagram of an exemplary transmitter 101 of the digital communications system 100 of FIG. 1A. In this embodiment, the transmitter 101 is equipped with a channel encoder (e.g., an FEC encoder) 113 that accepts input from an bit information source 111 and outputs coded stream of higher redundancy suitable for error correction processing at the receiver 105. Essentially, the encoder 113 generates the coded stream, and passes it to an interleaver 115, which reorders the sequence of symbols or bits from the encoder 113 in a predetermined manner. The interleaved signal is fed to a modulator 117 (e.g., in a satellite communications system), which maps the encoded messages from encoder 113 to signal waveforms that are transmitted over the communication channel 103 to a satellite via a transmit antenna 119.

FIG. 2 illustrates a satellite communications system capable of employing convolutional coding according to various exemplary embodiments. With reference to FIG. 2, an exemplary satellite communications system 200 is capable of supporting communication among terminals with varied capabilities, according to an embodiment of the present invention. Satellite communications system 200 includes a satellite 201 that supports communication among multiple satellite terminals (STs) 203, 205 and a HUB 211. The HUB 211 may assume the role of a Network Operations Center (NOC), which controls the access of the STs 203, 205 to the system 200 and also provides element management functions and control of the address resolution and resource management functionality. The satellite communications system 200 may operate as a traditional bent-pipe system, where the satellite essentially operates as a repeater. Alternatively, the satellite communications system 200 may employ a switching or processing satellite supporting mesh communications (point-to-point communications directly between, for example, the two STs 203, 205).

In a traditional bent-pipe system of an exemplary embodiment, the satellite 201 operates as a repeater or bent pipe, and communications between the STs 203, 205 are transmitted over a double-hop path. For example, in a communication from ST 203 to ST 205, over the first hop, the communication is transmitted, via the satellite, from the ST 203 to the HUB 211. The HUB 211 decodes the communication and determines the destination ST 205. The HUB 211 then appropriately addresses and repackages the communication, encodes and modulates it, and transmits the communication over the second hop, via the satellite, to the destination ST 205. Accordingly, the satellite of such a system acts as a bent pipe or repeater, transmitting communications between the HUB 211 and the STs 203, 205.

In an alternate embodiment, with a satellite communications system 200 that employs a processing satellite (e.g., including a packet switch operating, for example, at a data link layer), the system may support direct unicast (point-to-point) communications and multicast communications among the STs 203, 205. In the case of a processing satellite, the satellite 201 decodes the received signal and determines the destination ST or STs (as the HUB 211 would in a bent-pipe system). The satellite 201 then addresses the data accordingly, encodes and modulates it, and transmits the modulated signal, over the channel 113, to the destination ST or STs (e.g., ST 205). The STs 203, 205 provide connectivity to one or more hosts 207, 209, respectively. According to one embodiment of the present invention, the satellite communications system 200 has a fully meshed architecture, whereby the STs 203, 205 may directly communicate.

The data transmissions transmitted from the HUB 211 and from the STs 203, 205, through a satellite 201 of a bent-pipe system, for example, is commonly referred to as the forward link or the outroute, and the data transmissions received by the HUB 211 and received by the STs 203, 205 is commonly referred to as the return link or the inroute. In current systems, the outroute may typically be in the order of 30 to 45 Msps over which coded modulation data is sent. The outroute comprises a data stream of frames, where the data is encoded in codeblocks, and a receiving ST 203, 205 will typically demodulate and decode each frame to determine whether the data of the frame is destined to the particular receiving ST. Such transmission and reception schemes are described by the DVB-S2 ETSI EN 302 307 Standard, incorporated herein by reference in its entirety.

As introduced above, according to embodiments of next generation, high capacity satellite systems (e.g., systems of capacities exceeding 100 Gbps), bandwidth of outroutes are in the order of greater than 200 Msps (e.g., 220 Msps). Further, as also introduced above, to achieve relatively low complexity and low cost decoder ASIC designs for the STs 203, 205, certain multiplexing schemes may be employed to multiplex a number of lower throughput outroute data streams into one higher throughput outroute transmission stream. For example, as described in copending patent application Ser. No. 13/323,467, filed Dec. 12, 2011, and Ser. No. 13/086,702, filed Apr. 14, 2011, example embodiments of such multiplexing schemes are described.

Figure 3:
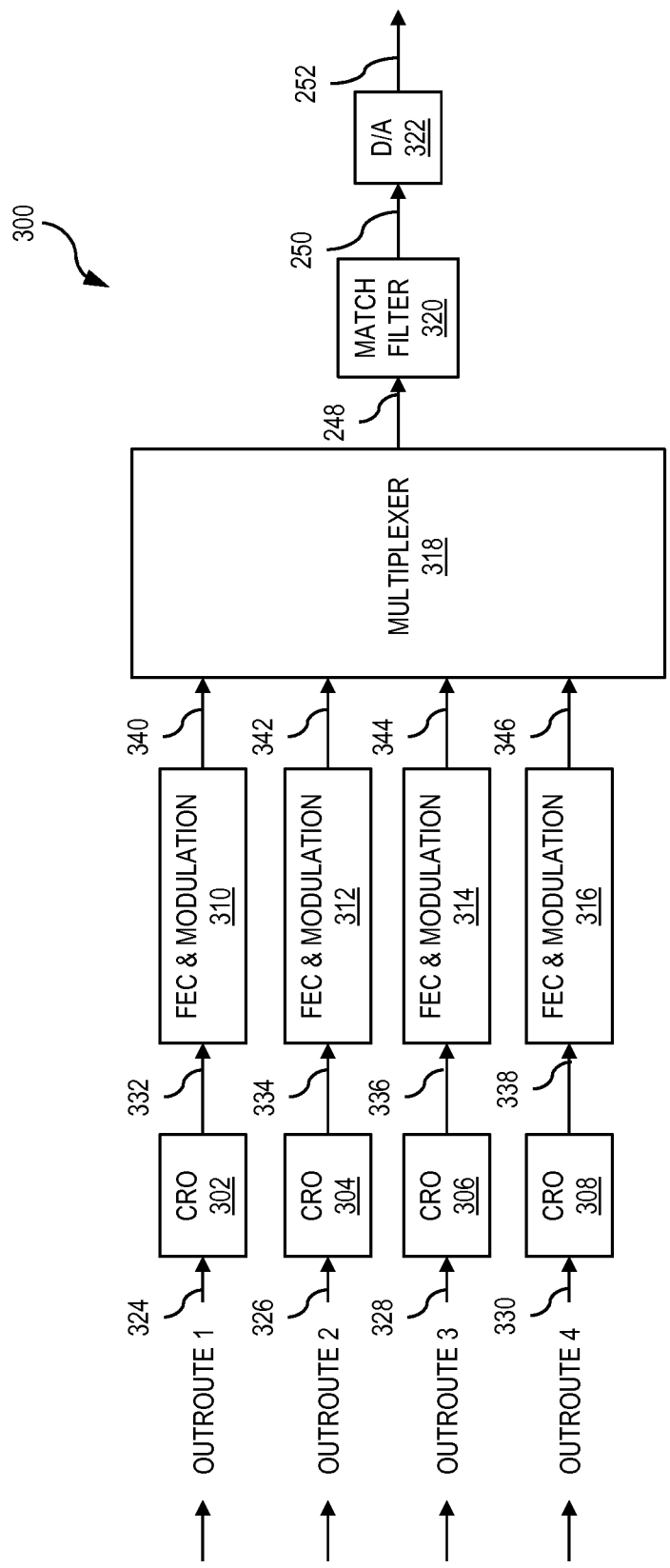
FIG. 3 illustrates a block diagram of a transmitter implementing a multi-carrier multiplexing scheme, in accordance with an exemplary embodiment.

FIG. 3 illustrates an example transmitter, in accordance with an exemplary embodiment where four individual outroute data streams are multiplexed into one outroute transmission stream. A transmitter 300 includes a code rate organizer (CRO) 302, a CRO 304, a CRO 306, a CRO 308, a modulator 310, a modulator 312, a modulator 314, a modulator 316, a multiplexer 318, a match filter 320 and a DAC 322. The CRO associates the information bits of the bit stream with the appropriate modulation and coding (modcod) for receipt by the receiving terminal. In other words, the CRO packages the information bits to be sent to a terminal into codeblocks at the appropriate modcod for receipt by the receiving terminal. CRO 302 may be arranged to receive an outroute stream signal 324 and output a signal 332. Modulator 310 may be arranged to output a modulated signal 340 based on signal 332. In some embodiments, modulator 310 is arranged to receive signal 332 directly from CRO 302. Similarly, CRO 304 may be arranged to receive an outroute stream signal 326 and output a signal 334. Modulator 312 may be arranged to output a modulated signal 342 based on signal 334. In some embodiments, modulator 312 is arranged to receive signal 334 directly from CRO 304. CRO 306 may be arranged to receive an outroute stream signal 328 and output a signal 336. Modulator 314 may be arranged to output a modulated signal 344 based on signal 336. In some embodiments, modulator 314 is arranged to receive signal 336 directly from CRO 306. CRO 308 may be arranged to receive an outroute stream signal 330 and output a signal 338. Modulator 316 may be arranged to output a modulated signal 346 based on signal 338. In some embodiments, modulator 316 is arranged to receive signal 338 directly from CRO 308. Multiplexer 318 may be arranged to output a multiplexed signal 348 based on modulated signals 340, 342, 344 and 346. In some embodiments, multiplexer 318 is arranged to receive modulated signals 340, 342, 344 and 346 directly from modulator 310, modulator 312, modulator 314 and modulator 316, respectively. Match filter 320 may be arranged to output a filtered signal 350 based on multiplexed signal 348. Non-limiting examples of modulation types supported by filtered signal 350 include TDM and CDM. In some embodiments, match filter 320 is arranged to receive multiplexed signal 348 directly from multiplexer 318. A match filter, on the transmitter side, is used to limit the bandwidth and reduce adjacent channel interference. On a corresponding receiver side (not shown), a match filter is used as an optimal linear filter for maximizing the signal to noise ratio in the presence of noise. DAC 322 may be arranged to output an analog signal 352 based on filtered signal 350. In some embodiments, DAC 322 is arranged to receive filtered signal 350 directly from match filter 320.

CRO 302, CRO 304, CRO 306 and CRO 308 perform modulation and coding of outroute stream signals 324, 326, 328 and 330, respectively, and output coded signals 332, 334, 336 and 338, respectively. Modulators 310, 312, 314 and 316, receive and encode and bit-to-symbol map coded signals 332, 334, 336 and 338, respectively, and output modulated signals 340, 342, 344 and 346, respectively. Multiplexer 318 multiplexes modulated signals 340, 342, 344 and 346 into one outroute stream as denoted by multiplexed signal 348. By multiplexing modulated signals 340, 342, 344 and 346 into one outroute stream, transmitter 300 is able to utilize a single device or resource, in this case DAC 322, to transmit a plurality of signals. Match filter 320 filters multiplexed signal 348 in order to maximize the signal-to-noise ratio of the transmitted signal. DAC 322 converts transmit filtered signal 350 to analog signal 352. Each pair of CRO 302 and modulator 310, CRO 304 and modulator 312, CRO 306 and modulator 314, and CRO 308 and modulator 316 may operate at relatively low rates (e.g., 55 Msps).

FIG. 8 illustrates a flow chart depicting a processes for encoding physical layer (PL) headers of a PL data frames to generate physical layer signaling (PLS) codewords for transmitting the PL data frames over a channel of a communications network, in accordance with exemplary embodiments;

According to exemplary embodiments, with respect to convolutional coding for DVB-S2 physical layer signaling (PLS) coding, an expanded PLS Code is provided (e.g., to support multi-carrier multiplexing within a wideband transponder of a wireless communications system), wherein the PL Header of the DVB-S2 standard is coded to provide a stream identification code (SID) (identifying the particular outroute stream from which the data of the respective packet originates), and to expand the MODCOD capabilities. In accordance with one such embodiment, an encoder codes 16 information bits for the PLS Code using 154 bits (e.g., a (16,154) convolutional code) to provide better performance over that of the current DVB-S2 Reed-Muller coding of 7 information bits using 64 bits (e.g., the current (7,64) Reed-Muller code of the DVB-S2 standard). The 16 information bits may comprise the following assignment scheme: (1) six bits indicate the MODCOD (e.g., an extra MODCOD bit over the five bits of the current DVB-S2 standard); (2) one bit indicates pilot on/off; (3) one bit indicates normal/short codeblock; and (4) eight bits indicate SID.

Figure 4:
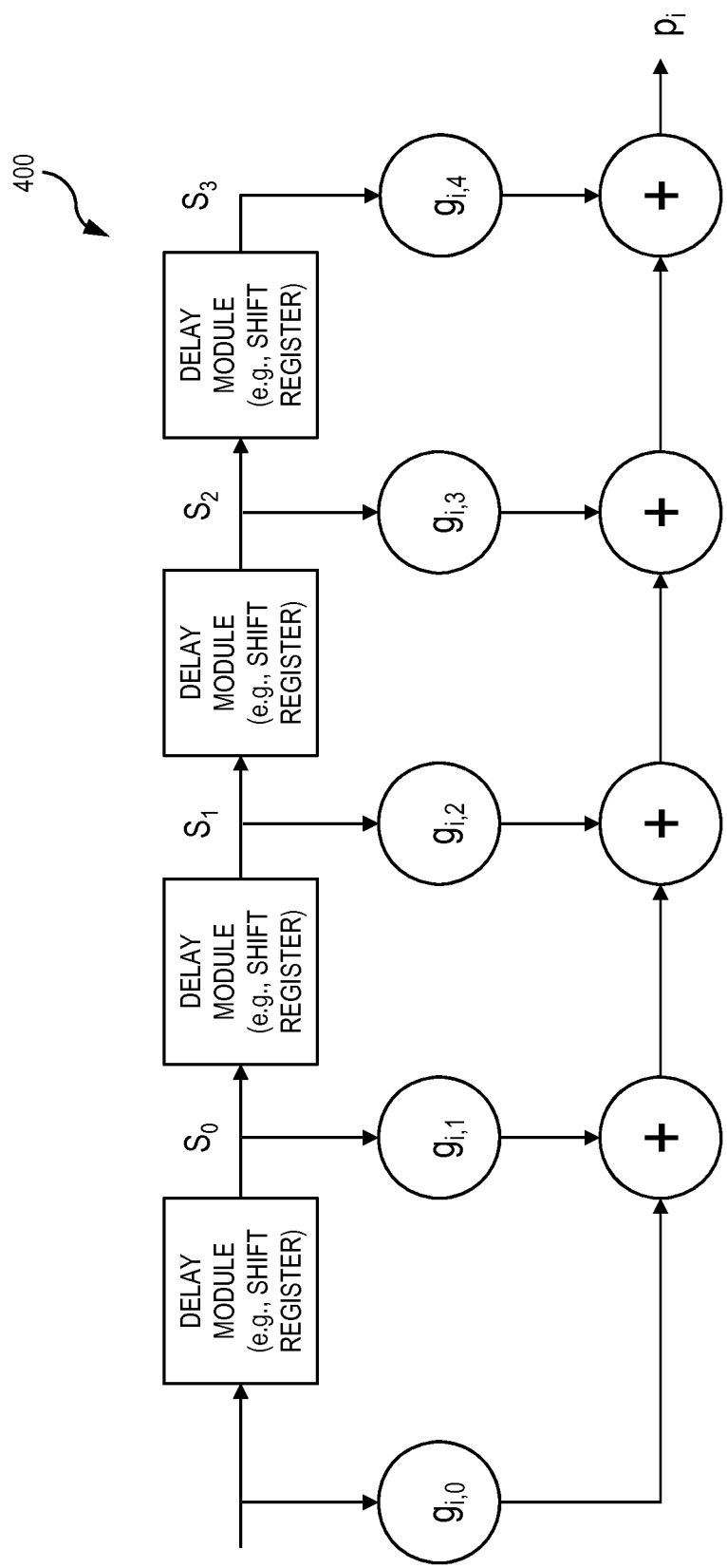
FIG. 4 illustrates a block diagram of the parity bit generator for an encoder, in accordance with an exemplary embodiment.

According to one exemplary embodiment, with reference to FIG. 8, a 16 state convolutional code is used to encode the 16 information bits into 154 coded bits to give a (16,154) codeword (Step 811). The (16,154) encoder comprises a convolutional coder of constraint length K=5, where the number of states is $2^{(K-1)}=16$, and each information bit generates 10 parity bits ($p_0, p_1, p_2, \ldots, p_9$). The code rate is 1/10. FIG. 4 illustrates the parity bit generator 400 for the encoder, in accordance with an exemplary embodiment, where the generator polynomials are as follows:

$g_i=(g_{i,0}, g_{i,1}, g_{i,2}, g_{i,3}, g_{i,4})$
$g_0=(11111)$
$g_1=(10111)$
$g_2=(11001)$
$g_3=(11011)$
$g_4=(11101)$
$g_5=(11011)$
$g_6=(10111)$
$g_7=(10101)$
$g_8=(10011)$
$g_9=(10001)$, where a "1" indicates a connection (and a 0 indicates no connection) for the respective $g_i$ position of FIG. 4 (Step 811). Further, in order to output only 154 coded bits (instead of 160) certain bits are punctured (Step 813). For example, if ($u_0, u_1, u_2, u_3, \ldots, u_{15}$) are the information bits, then for each of the information bits $u_0, u_3, u_6, u_9, u_{12}$ and $u_{15}$, the parity bit $p_9$ is punctured. In this manner, the puncturing is spread over the information bits thereby minimizing any adverse effects.

Accordingly, with reference to FIG. 4, considering information bit $u_0$ (for example) the parity bit $p_0$ is generated based on $g_0$ (11111), whereby $u_0$ is exclusive-or'ed with $S_0, S_1, S_2$ and $S_3$ to generate $p_0$ (each S bit is connected to the respective exclusive-or based on the "1" for each $g_0$ position). Then, parity bit $p_1$ is generated based on $g_1$ (10111), whereby $u_0$ is exclusive-or'ed with $S_1, S_2$ and $S_3$ to generate $p_1$ (the $S_0$ bit is not connected to the respective exclusive-or based on the "0" for position $g_{1,1}$). Similarly, parity bit $p_2$ is generated based on $g_2$ (11001), whereby $u_0$ is exclusive-or'ed with $S_0$ and $S_3$ to generate $p_2$ (the $S_1$ and $S_2$ bits are each not connected to the respective exclusive-or based on the "0" for positions $g_{2,2}$ and $g_{2,3}$). Further, parity bit $p_3$ is generated based on $g_3$ (11011), whereby $u_0$ is exclusive-or'ed with $S_0, S_2$ and $S_3$ to generate $p_3$ (the $S_1$ bit is not connected to the respective exclusive-or based on the "0" for position $g_{3,2}$). The remaining parity bits for information bit $u_0$ are similarly generated based on the generator polynomials $g_4, g_5, g_6, g_7, g_8$ and $g_9$. Further, as specified above, the parity bit $p_9$ is punctured for information bit $u_0$. For each subsequent information bit ($u_1, u_2, u_3, \ldots, u_{15}$), the ten parity bits are generated in the same manner, where the $p_9$ parity bits are punctured for only information bits $u_3, u_6, u_9, u_{12}$ and $u_{15}$. Alternatively, different parity bits may be punctured to eliminate the 6 bits to reduce the output to only 154 bits, but, as would be recognized by one of skill in the art, performance may be adversely affected by different puncturing patterns.

According to a further exemplary embodiment, in order to improve the decoder performance and save information bits, no flush bits are used, and instead tail biting is employed (Step 817). For example, depending on the input bits, the initial state is chosen so that the initial and final states are the same. The initial state is set as $S_0=u_{15}, S_1=u_{14}, S_2=u_{13}, S_3=u_{12}$. Further, no tail bits are transmitted.

According to exemplary embodiments, therefore, the (16, 154) convolutional code increases the information bits of the PLS Code from 7 bits to 16 bits, where the coded bits plus the start of frame unique word occupies two DVB-S2 slots (e.g., 2*90 symbols).

Figure 5:
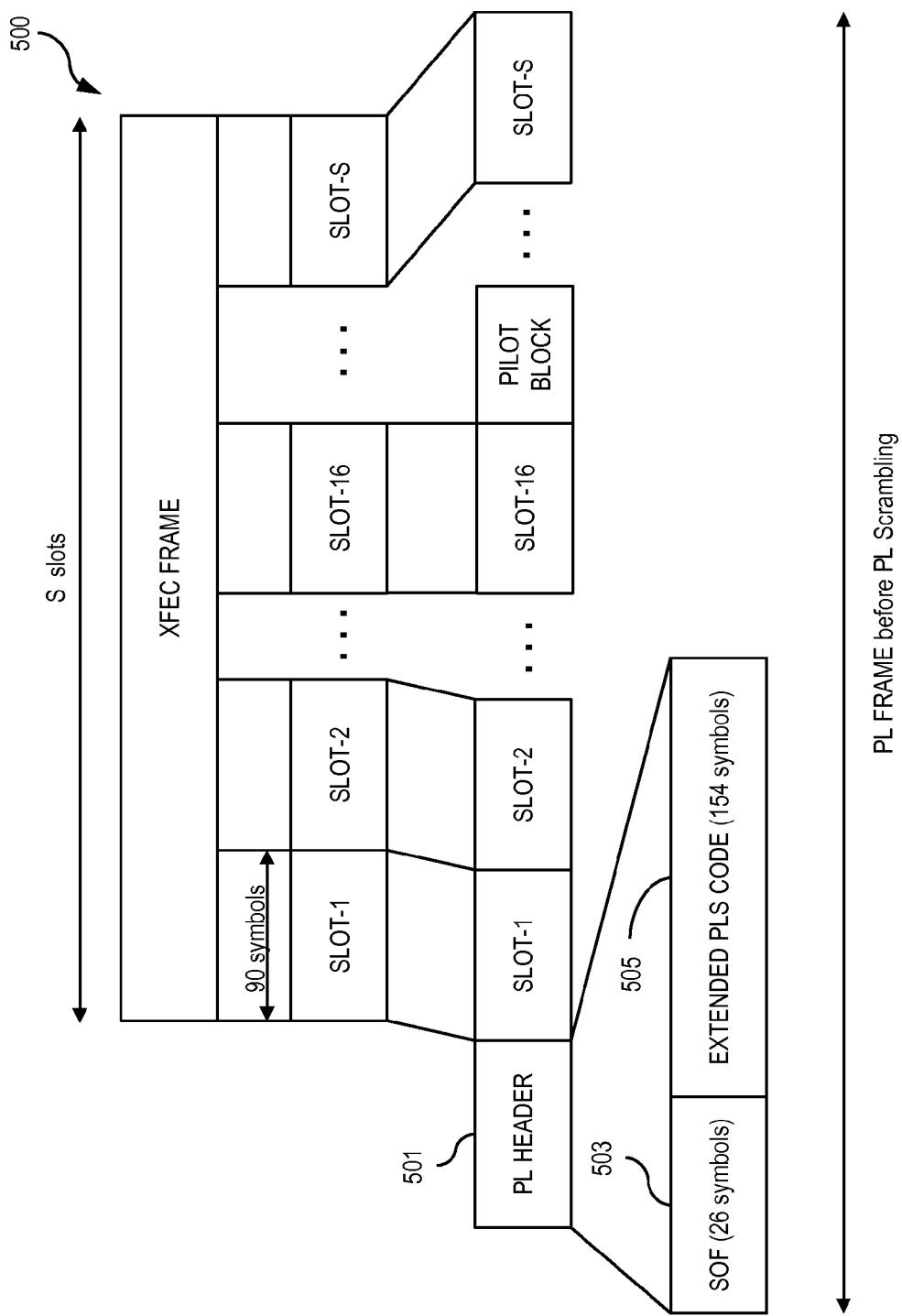
FIG. 5 illustrates the PL Frame of the DVB-S2 standard, with an extended PLHeader, in accordance with exemplary embodiments.

FIG. 5 illustrates the PL Frame 500 of the DVB-S2 standard, with an extended PLHeader in accordance with exemplary embodiments of the present invention. As is illustrated in FIG. 5, the extended PLHeader 501 includes 26 symbols representing the Start of Frame (SOF) 503, plus a 154 symbol PLS Code 505, coded in accordance with exemplary embodiments of the present invention.

Figure 6A:
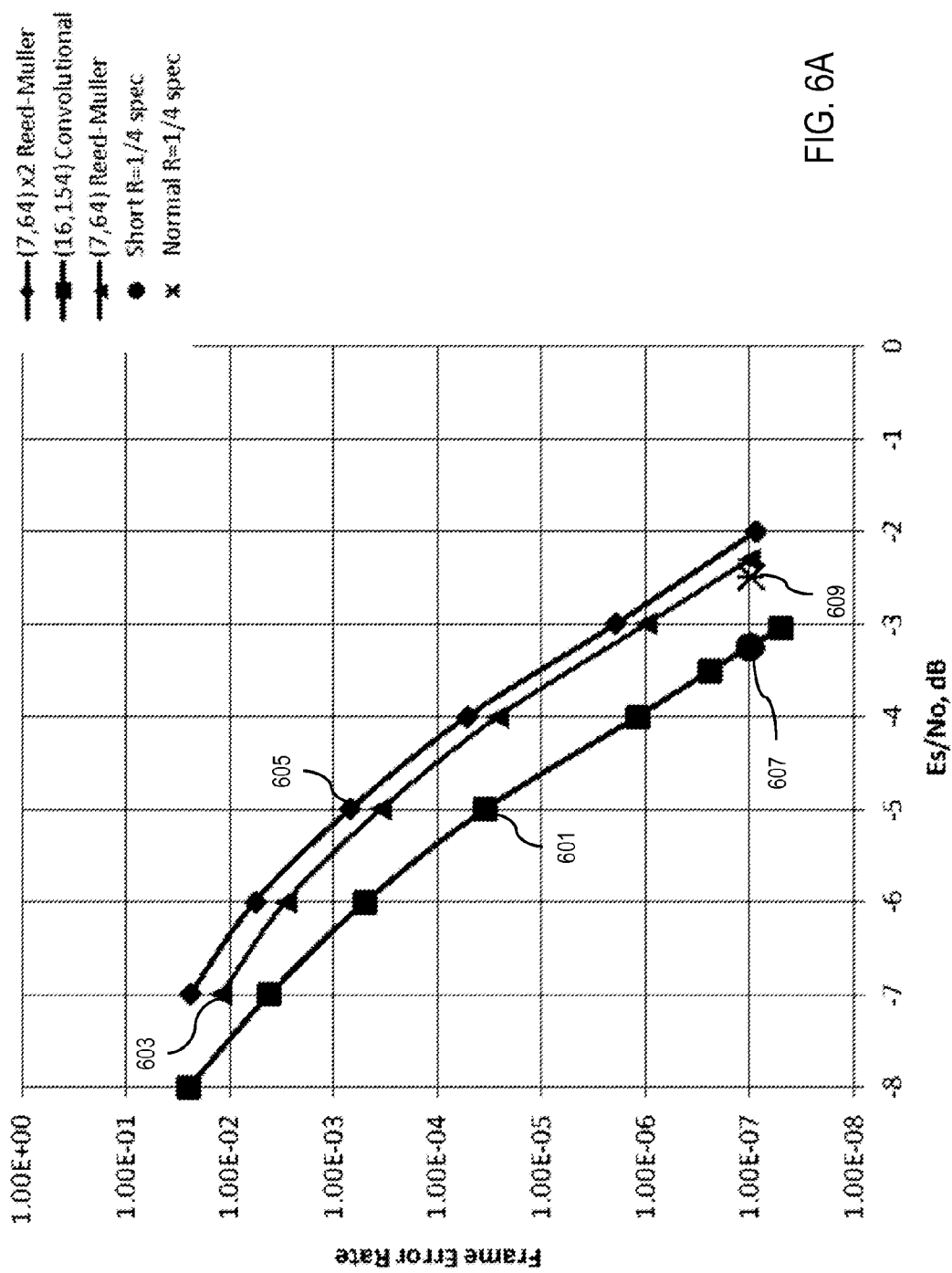
FIG. 6A illustrates performance curves of the Frame Error Rate versus the Es/No, for a (16,154) convolutional code (in accordance with an exemplary embodiment), as compared to the performance curves for a (7,64) Reed-Muller code (in accordance with the DVB-S2 standard) and a 2*(7,64) Reed-Muller code, along with the DVB-S2 MODCOD QPSK rate 1/4 short and normal codeblock spec points.

FIG. 6A illustrates performance curves of the Frame Error Rate versus the Es/No for a (16,154) convolutional code 601 (in accordance with an exemplary embodiment), as compared to the performance curves for a (7,64) Reed-Muller code 603 (in accordance with the DVB-S2 standard) and a 2*(7,64) Reed-Muller code 605. FIG. 6A also shows the DVB-S2 MODCOD QPSK rate 1/4 short spec point 607 and normal codeblock spec point 609.

With respect to the 2*(7,64) Reed-Muller code 605, to extend the information bits, the (7,64) Reed-Muller code of the DVB-S2 standard can be repeated as two (7,64) codes resulting in 14 information bits. As shown in FIG. 6, however, the performance of such a 2*(7,64) Reed-Muller code is significantly degraded over the performance of the (16,154) convolutional code, in accordance with embodiments of the present invention. Further, as is clear from the performance curves of FIG. 6, the (16,154) convolutional code 601 (according to embodiments of the present invention) significantly outperforms the (7,64) DVB-S2 Reed-Muller code 603, as well as the 2*(7,64) Reed-Muller code 605. Further, the (16,154) convolutional code 601 meets the specification for the short or the normal QPSK rate 1/4 MODCOD, whereas the Reed-Muller codes fail to meet such specifications.

According to a further exemplary embodiment, an extended PLS code is provided, which spans only one slot while allowing twice as many MODCODs as the current standard. For this PLS code, a rate 1/8 convolutional code is used to encode 8 information bits to generate an (8,64) codeword (Step 811). The code is generated by transmitting ($p_0$, $p_1$, $p_2$, $p_3$, $p_4$, $p_7$, $p_8$, $p_9$) for each of the 8 information bits. The code rate is 1/10. The parity bits $p_i$ (i=0, 1, 2, . . . 9) are generated according to the generator polynomials $g_i$ (i=0, 1, 2, . . . 9), as set forth above with reference to the parity bit generator 400 of FIG. 4. Namely:

$g_i = (g_{i,0}, g_{i,1}, g_{i,2}, g_{i,3}, g_{i,4})$
$g_0 = (11111)$
$g_1 = (10111)$
$g_2 = (11001)$
$g_3 = (11011)$
$g_4 = (11101)$
$g_5 = (11011)$
$g_6 = (10111)$
$g_7 = (10101)$
$g_8 = (10011)$
$g_9 = (10001)$, again, where a "1" indicates a connection (and a 0 indicates no connection) for the respective $g_i$ position of FIG. 4 (Step 811). In this case, parity bits p5 and p6 are punctured from the code (Step 813). In other words, in order to output only 64 coded bits (instead of the 80 generated bits –10 parity bits for each of the 8 information bits), parity bits $p_5$ and $p_6$ are punctured (not transmitted) for each of the information bits.

FIG. 6B illustrates performance curve of the Frame Error Rate versus the Es/No for the (8,64) convolutional code 621 (in accordance with the present exemplary embodiment), as compared to the performance curve for a traditional (8,64) Reed-Muller code 623. FIG. 6B also shows the rate 1/4 short spec point 625, the rate 1/4 normal spec point 627, the rate 1/3 short spec point 629 and the rate 1/3 normal spec point 631. As is evident from FIG. 6B, the rate (8,64) convolutional code of the present embodiment achieves a performance level comparable to the performance of the extended (8,64) Reed-Muller code, while avoiding the multiple scrambling sequence complexity of the extended Reed-Muller code.

According to another exemplary embodiment, a further (16,154) code is provided, wherein the (16,154) code is generated by repeating a (16,77) code of an exemplary embodiment (Step 815). In other words, where ($c_0$, $c_1$, $c_2$, . . . , $c_{76}$) denotes a codeword of the (16,77) code, a (16,154) codeword can be generated by repeating the bits of the (16,77). For example, in the case of the (16,77) codeword of ($c_0$, $c_1$, $c_2$, . . . , $c_{76}$), a (16,154) codeword can be represented as ($c_0$, $c_0$, $c_1$, $c_1$, $c_2$, $c_2$, . . . , $c_{76}$, $c_{76}$). The (16,77) encoder comprises a convolutional coder of constraint length K=5, where the number of states is $2^{(K-1)}=16$, and each information bit generates 5 parity bits ($p_0$, $p_1$, $p_2$, $p_3$, $p_4$). The code rate is 1/5. FIG. 4 illustrates the parity bit generator 400 for the encoder, in accordance with an exemplary embodiment, where the generator polynomials are as follows:

$g_i = (g_{i,0}, g_{i,1}, g_{i,2}, g_{i,3}, g_{i,4})$
$g_0 = (10101)$
$g_1 = (10111)$
$g_2 = (11011)$
$g_3 = (11111)$
$g_4 = (11001)$, where a "1" indicates a connection (and a 0 indicates no connection) for the respective $g_i$ position of FIG. 4 (Step 811). Further, in order to output only 77 coded bits (instead of the 80 generated bits –5 parity bits for each of the 16 information bits) certain bits are punctured (Step 813). For example, if ($u_0$, $u_1$, $u_2$, $u_3$, $u_{15}$) are the information bits, then for each of the information bits $u_3$, $u_8$, and $u_{13}$, the parity bit $p_4$ is punctured. In this manner, the puncturing is spread over the information bits thereby minimizing any adverse effects. Again, alternatively, different parity bits may be punctured to eliminate the 6 bits to reduce the output to only 154 bits, but, as would be recognized by one of skill in the art, performance may be adversely affected by different puncturing patterns.

Figure 6C:
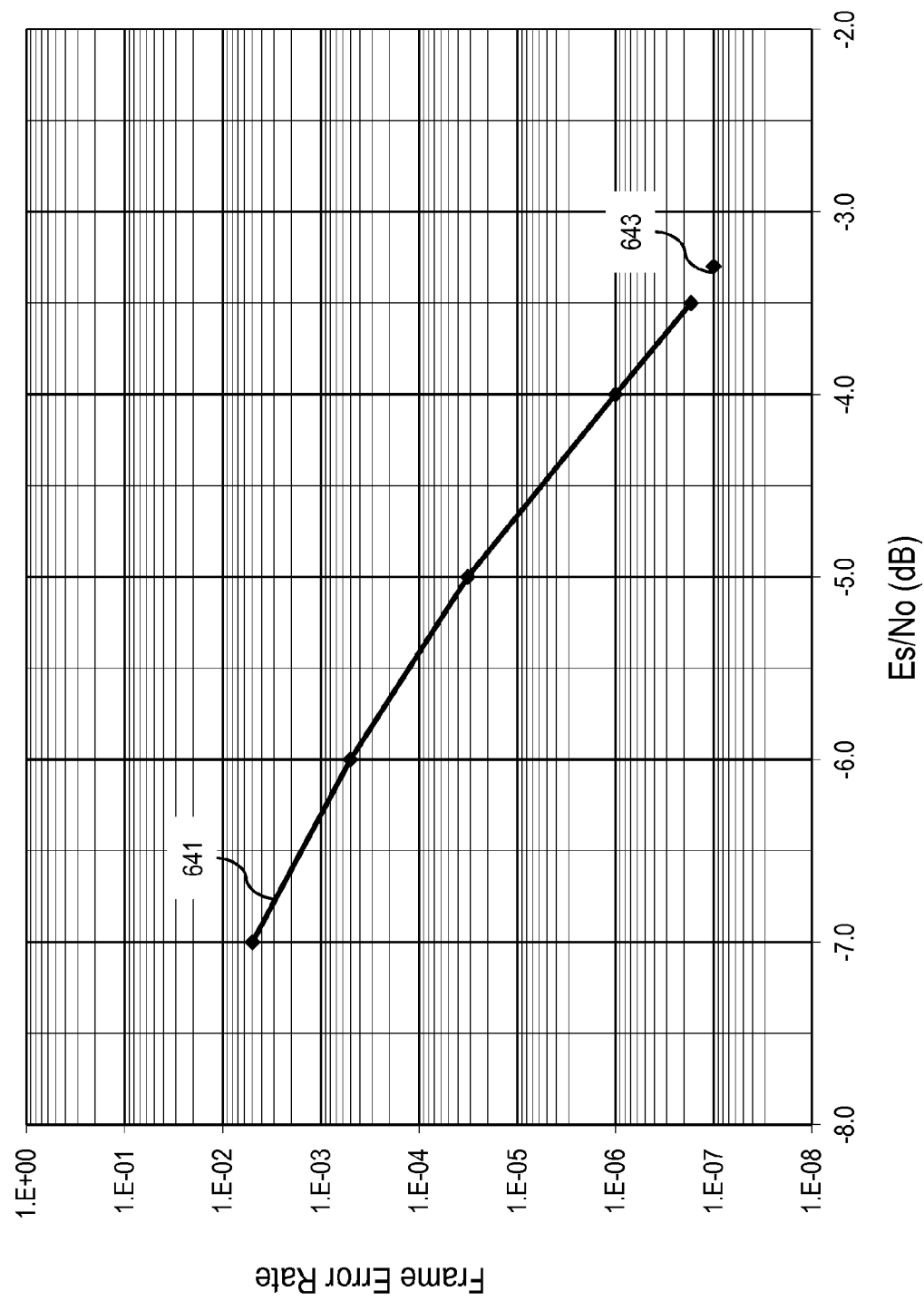
FIG. 6C illustrates performance curves of the Frame Error Rate versus the Es/No for a (16,154) convolutional code (in accordance with an exemplary embodiment), along with the rate 1/4 short spec point.

FIG. 6C illustrates a performance curve of the Frame Error Rate versus the Es/No for this (16,154) convolutional code 641. FIG. 6C also shows the rate 1/4 short spec point 643.

Figure 7A:
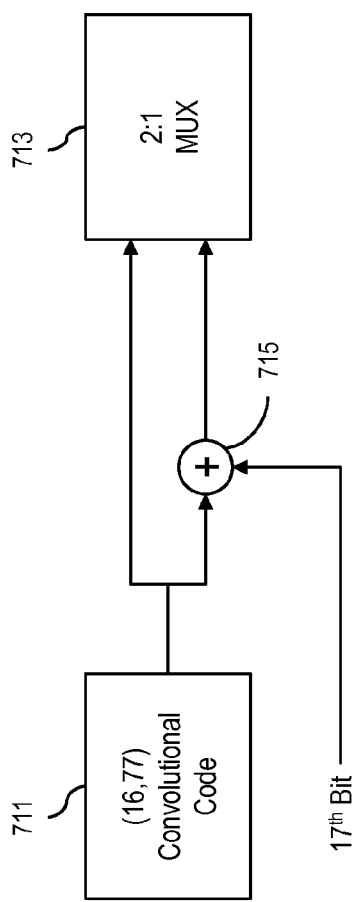
FIGS. 7A and 7B illustrate block diagrams reflecting the repetition of the bits of a (16,77) codeword to generate a (16+b,154) codeword, in accordance with exemplary embodiments.
Figure 7B:
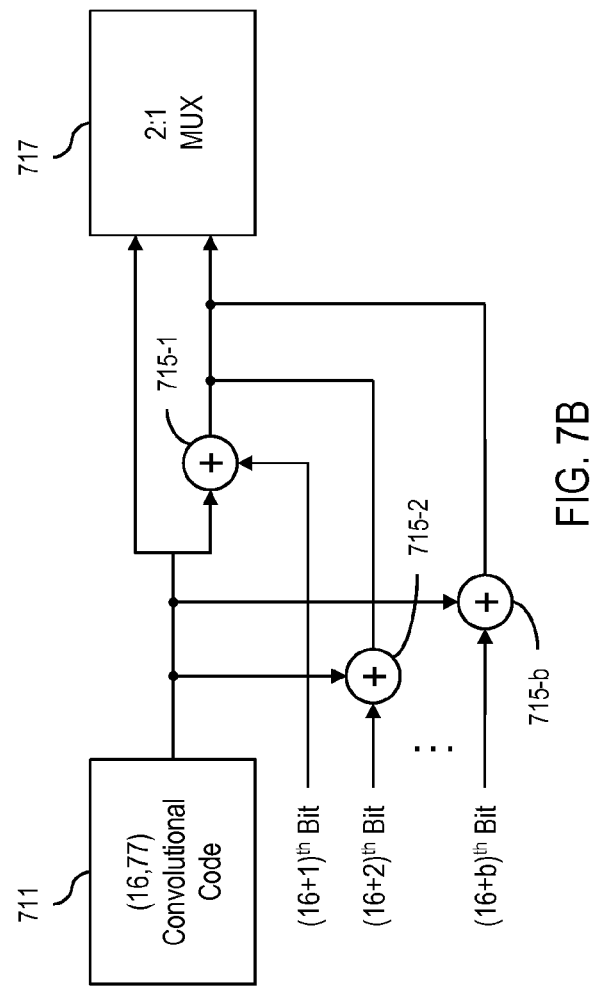

According to a further exemplary embodiment, additional information bits can be encoded onto the repeated (16,77) codeword described above, to generate a (16+b,154) code, where b is the number of additional information bits. FIG. 7A illustrates an example where b=1, and FIG. 7B illustrates a general example where b is a variable. With reference to FIG. 7A, the 77 bits of the (16,77) codeword 711 are fed to one input of the 2:1 multiplexer 713 (Step 819). The 77 bits of the (16,77) codeword 711 are also fed to one input of an Exclusive-OR function 715 (Step 823), and the $17^{th}$ information bit is fed to the other input of the Exclusive-OR function 715 (Step 825). The output of the Exclusive-OR function 715 is fed to the other input of the 2:1 multiplexer 713 (Step 825). Accordingly, depending on the value of the $17^{th}$ information bit, each bit of the (16,77) codeword 711 will either be input into the 2:1 multiplexer 713 as is or inverted if the $17^{th}$ information bit is zero, then the codeword bits will be repeated as is, and if $17^{th}$ information bit is one, then the inverse of each codeword bit will be repeated. In other words, based on the value of the $17^{th}$ bit, the transmitted (17,154) codeword will be either ($c_0$, $c_0$, $c_1$, $c_1$, $c_2$, $c_2$, . . . , $c_{76}$, $c_{76}$) or ($c_0$, $c_0 \oplus 1$, $c_1$, $c_1 \oplus 1$, $c_2$, $c_2 \oplus 1$, . . . $c_{76}$, $c_{76} \oplus 1$).

With reference to FIG. 7B, the 77 bits of the (16,77) codeword 711 are fed to one input of the 2:1 multiplexer 717 (Step 819). The 77 bits of the (16,77) codeword 711 are also split into b groups of consecutive bits (Step 821), each being of an integer number of bits approximately equal to 77/b), where the number of bits (77/b) for each group is rounded down to the next integer (the fraction is dropped), and the remaining bits can be distributed amongst the groups in any fashion. For example, if b=3, then two of the groups can each have 26 consecutive bits of the original 77, and the third group will have the remaining 25 consecutive bits (77/3=25.67→each group contains 25 bits, and the remaining 2 bits are distributed amongst two of the groups). As with the example of b=1, the codeword bits of each group are fed into one input of an Exclusive-OR function (715-1, 715-2, ... 715-b) (Step 823), and the other input of the Exclusive-OR function would be one of the b additional bits (Step 825). The outputs of the Exclusive-OR functions are then fed to the other input of the 2:1 multiplexer (Step 825). The 2:1 multiplexer 717 would then clearly be designed such that, as it cycles through the insertion of the repeated bits, it would switch through the bit group feeds from the Exclusive-OR functions in an appropriate manner. Accordingly, (as with the above example of b=1) each group of bits from the (16,77) codeword 711 is repeated as is or repeated as an inverse, depending on the value of the additional information bit fed into the respective Exclusive-OR function. For example, in the case of b=3 ($i_1$, $i_2$, $i_3$), the transmitted (19,154) codeword will be as follows:

($c_0$, $c_0 \oplus i_1$, $c_1$, $c_1 \oplus i_1$, ... $c_{25}$, $c_{25} \oplus i_1$,
$c_{26}$, $c_{26} \oplus i_2$, $c_{27}$, $c_{27} \oplus i_2$, ... $c_{51}$, $c_{51} \oplus i_2$,
$c_{52}$, $c_{52} \oplus i_3$, $c_{53}$, $c_{53} \oplus i_3$, ... $c_{76}$, $c_{76} \oplus i_3$)

Further, as would be evident to one of skill in the art, the particular distribution of the specific bit grouping methods for the (16,77) codeword bits may be accomplished in various different manners without departing from the general scope of the invention, and that a main consideration would be the associated complexity required for the receiver.

The methods and apparatuses described herein for convolutional coding for DVB-S2 PLS coding may be implemented via software, hardware (e.g., general processor, Digital Signal Processing (DSP) chip, an Application Specific Integrated Circuit (ASIC), Field Programmable Gate Arrays (FPGAs), etc.), firmware or a combination thereof. Such exemplary hardware for performing the described functions is detailed below.

FIG. 9 illustrates a computer system upon which exemplary embodiments may be implemented. The computer system 900 includes a bus 901 or other communication mechanism for communicating information, and a processor 903 coupled to the bus 901 for processing information. The computer system 900 also includes main memory 905, such as a random access memory (RAM) or other dynamic storage device, coupled to the bus 901 for storing information and instructions to be executed by the processor 903. Main memory 905 can also be used for storing temporary variables or other intermediate information during execution of instructions to be executed by the processor 903. The computer system 900 further includes a read only memory (ROM) 907 or other static storage device coupled to the bus 901 for storing static information and instructions for the processor 903. A storage device 909, such as a magnetic disk or optical disk, is additionally coupled to the bus 801 for storing information and instructions.

According to one embodiment of the invention, convolutional coding for DVB-S2 PLS coding in accordance with exemplary embodiments is provided by the computer system 900 in response to the processor 903 executing an arrangement of instructions contained in main memory 905. Such instructions can be read into main memory 905 from another computer-readable medium, such as the storage device 909. Execution of the arrangement of instructions contained in main memory 905 causes the processor 903 to perform the process steps described herein. One or more processors in a multi-processing arrangement may also be employed to execute the instructions contained in main memory 905. In alternative embodiments, hard-wired circuitry may be used in place of or in combination with software instructions to implement the embodiment of the present invention. Thus, embodiments of the present invention are not limited to any specific combination of hardware circuitry and software. The computer system 900 also includes a communication interface 917 coupled to bus 901.

The term "computer-readable medium" as used herein refers to any medium that participates in providing instructions to the processor 903 for execution. Such a medium may take many forms, including but not limited to non-volatile media, volatile media, and transmission media. Non-volatile media include, for example, optical or magnetic disks, such as storage device 909. Volatile media include dynamic memory, such as main memory 905. Transmission media include coaxial cables, copper wire and fiber optics, including the wires that comprise bus 901. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD ROM, CDRW, DVD, any other optical medium, punch cards, paper tape, optical mark sheets, any other physical medium with patterns of holes or other optically recognizable indicia, a RAM, a PROM, and EPROM, a FLASH EPROM, any other memory chip or cartridge, a carrier wave, or any other medium from which a computer can read.

Figure 10:
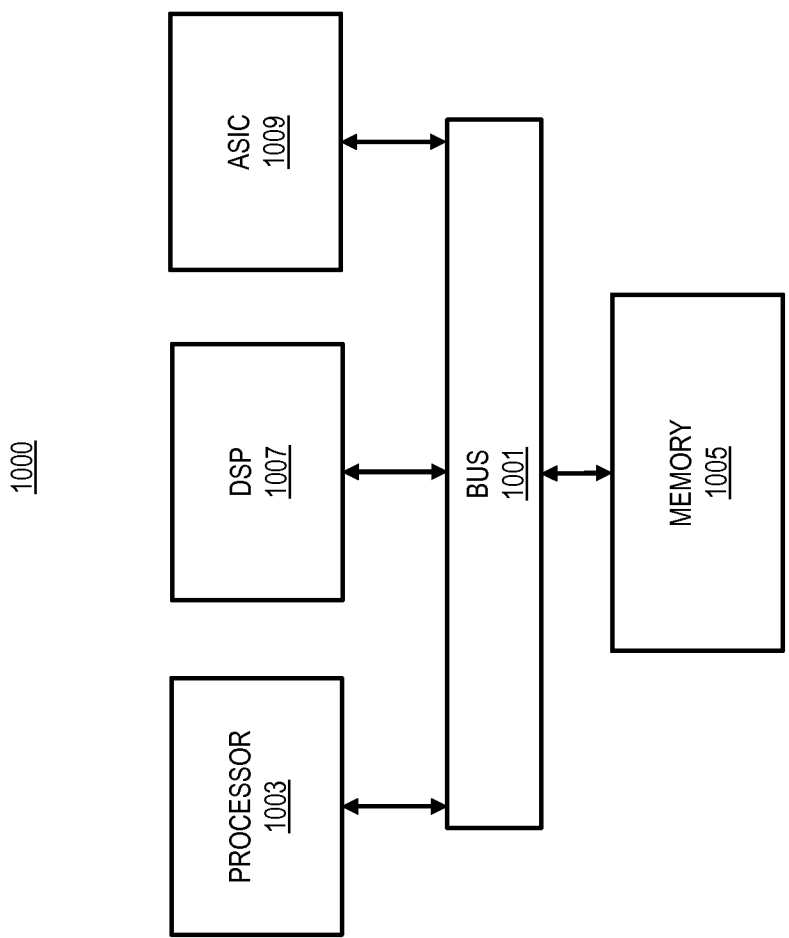
FIG. 10 illustrates a chip set, in accordance with exemplary embodiments.

FIG. 10 illustrates a chip set 1000 in which embodiments of the invention may be implemented. Chip set 1000 includes, for instance, processor and memory components described with respect to FIG. 10 incorporated in one or more physical packages. By way of example, a physical package includes an arrangement of one or more materials, components, and/or wires on a structural assembly (e.g., a baseboard) to provide one or more characteristics such as physical strength, conservation of size, and/or limitation of electrical interaction.

In one embodiment, the chip set 1000 includes a communication mechanism such as a bus 1001 for passing information among the components of the chip set 1000. A processor 1003 has connectivity to the bus 1001 to execute instructions and process information stored in, for example, a memory 1005. The processor 1003 may include one or more processing cores with each core configured to perform independently. A multi-core processor enables multiprocessing within a single physical package. Examples of a multi-core processor include two, four, eight, or greater numbers of processing cores. Alternatively or in addition, the processor 1003 may include one or more microprocessors configured in tandem via the bus 1001 to enable independent execution of instructions, pipelining, and multithreading. The processor 1003 may also be accompanied with one or more specialized components to perform certain processing functions and tasks such as one or more digital signal processors (DSP) 1007, and/or one or more application-specific integrated circuits (ASIC) 1009. A DSP 1007 typically is configured to process real-world signals (e.g., sound) in real time independently of the processor 1003. Similarly, an ASIC 1009 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 1003 and accompanying components have connectivity to the memory 1005 via the bus 1001. The memory 1005 includes both dynamic memory (e.g., RAM) and static memory (e.g., ROM) for storing executable instructions that, when executed by the processor 1003 and/or the DSP 1007 and/or the ASIC 1009, perform the process of exemplary embodiments as described herein. The memory 1005 also stores the data associated with or generated by the execution of the process.

In the preceding specification, various embodiments have been described with reference to the accompanying drawings. It will, however, be evident that various modifications and changes may be made thereto, and additional embodiments may be implemented, without departing from the broader scope of the invention. The specification and drawings are accordingly to be regarded in an illustrative rather than restrictive sense.

What is claimed is:

1. A method comprising:
    encoding, by a processor of a device, a physical layer (PL) header of a PL data frame, wherein the PL header comprises sixteen information bits $u_i$, (i=0, 1, 2, ..., 15), and the encoding is based on a convolutional code, whereby, for each information bit $u_i$, (i=0, 1, 2, ..., 15), ten associated parity bits $p_{i,k}$, (k=0, 1, 2, ..., 9) are generated, resulting in 160 codebits; and
    puncturing the resulting 160 codebits to form a (16,154) physical layer signaling (PLS) codeword for transmission of the PL data frame over a channel of a communications network;
    wherein, for each information bit $u_i$, (i=0, 1, 2, ..., 15), each of the associated ten parity bits $p_{i,k}$, (k=0, 1, 2, ..., 9) is generated based on a parity bit generator, as follows:
    $p_{i,k} = (u_i * g_{k,0}) \oplus (S_0 * g_{k,1}) \oplus (S_1 * g_{k,2}) \oplus (S_2 * g_{k,3}) \oplus (S_3 * g_{k,4})$,
    where $S_0 = u_{i-1}$, $S_1 = u_{i-2}$, $S_2 = u_{i-3}$, $S_3 = u_{i-4}$, and
    wherein generator polynomials for $g_k = (g_{k,0}, g_{k,1}, g_{k,2}, g_{k,3}, g_{k,4})$, are as follows:
    $g_0 = (1, 1, 1, 1, 1)$
    $g_1 = (1, 0, 1, 1, 1)$
    $g_2 = (1, 1, 0, 0, 1)$
    $g_3 = (1, 1, 0, 1, 1)$
    $g_4 = (1, 1, 1, 0, 1)$
    $g_5 = (1, 1, 0, 1, 1)$
    $g_6 = (1, 0, 1, 1, 1)$
    $g_7 = (1, 0, 1, 0, 1)$
    $g_8 = (1, 0, 0, 1, 1)$
    $g_9 = (1, 0, 0, 0, 1)$.

2. The method of claim 1, wherein the puncturing of the resulting 160 codebits comprises puncturing the parity bits $p_{0,9}, p_{3,9}, p_{6,9}, p_{9,9}, p_{12,9}, p_{15,9}$ (the tenth parity bit for each of the information bits $u_0, u_3, u_6, u_9, u_{12}, u_{15}$).

3. The method of claim 1, further comprising performing tail biting, wherein initial states for $S_0, S_1, S_2, S_3$ are set as $S_0 = u_{15}, S_1 = u_{14}, S_2 = u_{13}, S_3 = u_{12}$, and no tail bits are transmitted.

4. The method of claim 1, wherein the PL header information bits comprise a six bit modulation and coding (MOD-COD) field indicating modulation and coding schemes applied to a data payload portion of the PL data frame, a one bit pilot field indicating whether pilot symbols are present in the PL data frame, a one bit type field indicating a codeblock type of the data payload portion of the PL data frame, and an eight bit stream identification (SID) field indicating a source data stream from which the data payload portion of the PL data frame originated.

5. A method comprising:
    encoding, by a processor of a device, a physical layer (PL) header of a PL data frame, wherein the PL header comprises eight information bits $u_i$, (i=0, 1, 2, ..., 7), and the encoding is based on a convolutional code, whereby, for each information bit $u_i$, (i=0, 1, 2, ..., 7), ten associated parity bits $p_{i,k}$, (k=0, 1, 2, ..., 9) are generated, resulting in 80 codebits; and
    puncturing the resulting 80 codebits to form an (8,64) physical layer signaling (PLS) codeword for transmission of the PL data frame over a channel of a communications network;
    wherein, for each information bit $u_i$, (i=0, 1, 2, ..., 7), each of the associated ten parity bits $p_{i,k}$, (k=0, 1, 2, ..., 9) is generated based on a parity bit generator, as follows:
    $p_{i,k} = (u_i * g_{k,0}) \oplus (u_{i-1} * g_{k,1}) \oplus (u_{i-2} * g_{k,2}) \oplus (u_{i-3} * g_{k,3}) \oplus (u_{i-4} * g_{k,4})$
    wherein generator polynomials for $g_k = (g_{k,0}, g_{k,1}, g_{k,2}, g_{k,3}, g_{k,4})$, are as follows:
    $g_0 = (1, 1, 1, 1, 1)$
    $g_1 = (1, 0, 1, 1, 1)$
    $g_2 = (1, 1, 0, 0, 1)$
    $g_3 = (1, 1, 0, 1, 1)$
    $g_4 = (1, 1, 1, 0, 1)$
    $g_5 = (1, 1, 0, 1, 1)$
    $g_6 = (1, 0, 1, 1, 1)$
    $g_7 = (1, 0, 1, 0, 1)$
    $g_8 = (1, 0, 0, 1, 1)$
    $g_9 = (1, 0, 0, 0, 1)$.

6. The method of claim 5, wherein the puncturing of the resulting 80 codebits comprises puncturing the parity bits $p_{0,5}, p_{0,6}, p_{1,5}, p_{1,6}, p_{2,5}, p_{2,6}, p_{3,5}, p_{3,6}, p_{4,5}, p_{4,6}, p_{5,5}, p_{5,6}, p_{6,5}, p_{6,6}, p_{7,5}, p_{7,6}$ (the fourth and fifth parity bits for each of the information bits $u_0, u_1, u_2, \ldots, u_7$).

7. The method of claim 5, further comprising performing tail biting, wherein initial states for $S_0, S_1, S_2, S_3$ are set as $S_0 = u_7, S_1 = u_6, S_2 = u_5, S_3 = u_4$, and no tail bits are transmitted.

8. The method of claim 5, wherein the PL header information bits comprise a six bit modulation and coding (MOD-COD) field indicating modulation and coding schemes applied to a data payload portion of the PL data frame, a one bit pilot field indicating whether pilot symbols are present in the PL data frame, and a one bit type field indicating a codeblock type of the data payload portion of the PL data frame.

9. A method comprising:
    encoding, by a processor of a device, a physical layer (PL) header of a PL data frame, wherein the PL header comprises sixteen information bits $u_i$, (i=0, 1, 2, ..., 15), and the encoding is based on a convolutional code, whereby, for each information bit $u_i$, (i=0, 1, 2, ..., 15), five associated parity bits $p_{i,k}$, (k=0, 1, 2, 3, 4) are generated, resulting in 80 codebits;
    puncturing the resulting 80 codebits to form a (16,77) codeword of 77 codebits ($c_0, c_1, c_2, \ldots, c_{76}$); and
    repeating the codebits of the (16,77) codeword to generate a (16,154) physical layer signaling (PLS) codeword ($c_0, c_0, c_1, c_1, c_2, c_2, \ldots, c_{76}, c_{76}$) for transmission of the PL data frame over a channel of a communications network;
    wherein, for each information bit $u_i$, (i=0, 1, 2, ..., 15), each of the associated five parity bits $p_{i,k}$, (k=0, 1, 2, 3, 4) is generated based on a parity bit generator, as follows:
    $p_{i,k} = *(u_i * g_{k,0}) \oplus (S_0 * g_{k,1}) \oplus (S_1 * g_{k,2}) \oplus (S_2 * g_{k,3}) \oplus (S_3 * g_{k,4})$,
    where $S_0 = u_{i-1}, S_1 = u_{i-2}, S_2 = u_{L-3}, S_3 =$, and
    wherein generator polynomials for $g_k = (g_{k,0}, g_{k,1}, g_{k,2}, g_{k,3}, g_{k,4})$, are as follows:

$g_0=(1, 0, 1, 0, 1)$
$g_1=(1, 0, 1, 1, 1)$
$g_2=(1, 1, 0, 1, 1)$
$g_3=(1, 1, 1, 1, 1)$
$g_4=(1, 1, 0, 0, 1)$.

10. The method of claim 9, wherein the puncturing of the resulting 80 codebits comprises puncturing the parity bits $p_{3,4}, p_{8,4}, p_{13,4}$ (the third parity bit for each of the information bits $u_3, u_8, u_{13}$).

11. The method of claim 9, further comprising performing tail biting, wherein initial states for $S_0, S_1, S_2, S_3$ are set as $S_0=u_{15}, S_1=u_{14}, S_2=u_{13}, S_3=u_{12}$, and no tail bits are transmitted.

12. The method of claim 9, wherein the PL header information bits comprise a six bit modulation and coding (MOD-COD) field indicating modulation and coding schemes applied to a data payload portion of the PL data frame, a one bit pilot field indicating whether pilot symbols are present in the PL data frame, a one bit type field indicating a codeblock type of the data payload portion of the PL data frame, and an eight bit stream identification (SID) field indicating a source data stream from which the data payload portion of the PL data frame originated.

13. The method of claim 9, wherein the repetition of the codebits of the (16,77) codeword comprises:
    inputting the (16,77) codeword into a first input of a 2:1 multiplexer function;
    dividing the (16,77) codeword into N groups of consecutive codebits, each group being of an integer number of codebits approximately equal to 77/N;
    inputting the codebits of each group into a first input of a respective Exclusive OR function; and
    encoding N additional information bits to generate a (16+N, 154) physical layer signaling (PLS) codeword for transmission of the PL data frame over a channel of a communications network;
    wherein the encoding of the N additional information bits comprises inputting each of the N additional information bits into a second input of a respective one of the Exclusive OR functions, and inputting the outputs of each of the Exclusive OR functions into a second input of the 2:1 multiplexer, wherein, as the 2:1 multiplexer cycles through the insertion of the repeated bits, it switches through the bit group feeds from the Exclusive-OR functions, and each group of codebits from the (16, 77) codeword is repeated as is or repeated as an inverse, depending on the value of the additional information bit fed into the respective Exclusive-OR function.

14. The method of claim 13, wherein the number of bits (77/N) for each group is rounded down to the next integer, and the remaining codebits are distributed amongst the groups in any fashion.

15. An apparatus comprising:
    an encoder configured to encode a physical layer (PL) header of a PL data frame, wherein the PL header comprises sixteen information bits $u_i$, (i=0, 1, 2, ..., 15), and the encoding is based on a convolutional code, whereby, for each information bit $u_i$, (i=0, 1, 2, ..., 15), ten associated parity bits $p_{i,k}$, (k=0, 1, 2, ..., 9) are generated, resulting in 160 codebits;
    a puncturing module configured to puncture the resulting 160 codebits to form a (16,154) physical layer signaling (PLS) codeword for transmission of the PL data frame over a channel of a communications network; and
    a parity bit generator configured to generate, for each information bit $u_i$, (i=0, 1, 2, ..., 15), ten associated parity bits $p_{i,k}$, (k=0, 1, 2, ..., 9), as follows:
    $p_{i,k}=(u_i*g_{k,0})\oplus(S_0*g_{k,1})\oplus(S_1*g_{k,2})\oplus(S_2*g_{k,3})\oplus(S_3*g_{k,4})$
    where $S_0=u_{i-1}, S_1=u_{i-2}, S_2=u_{i-3}, S_3=u_{i-4}$, and
    wherein generator polynomials for $g_k=(g_{k,0}, g_{k,1}, g_{k,2}, g_{k,3}, g_{k,4})$, are as follows:
    $g_0=(1, 1, 1, 1, 1)$
    $g_1=(1, 0, 1, 1, 1)$
    $g_2=(1, 1, 0, 0, 1)$
    $g_3=(1, 1, 0, 1, 1)$
    $g_4=(1, 1, 1, 0, 1)$
    $g_5=(1, 1, 0, 1, 1)$
    $g_6=(1, 0, 1, 1, 1)$
    $g_7=(1, 0, 1, 0, 1)$
    $g_8=(1, 0, 0, 1, 1)$
    $g_9=(1, 0, 0, 0, 1)$.

16. The apparatus of claim 15, wherein the puncturing of the resulting 160 codebits comprises puncturing the parity bits $p_{0,9}, p_{3,9}, p_{6,9}, p_{9,9}, p_{12,9}, p_{15,9}$ (the tenth parity bit for each of the information bits $u_0, u_3, u_6, u_9, u_{12}, u_{15}$).

17. The apparatus of claim 15, wherein the puncturing module is further configured to perform tail biting, wherein initial states for $S_0, S_1, S_2, S_3$ are set as $S_0=u_{15}, S_1=u_{14}, S_2=u_{13}, S_3=u_{12}$, and no tail bits are transmitted.

18. An apparatus comprising:
    an encoder configured to encode a physical layer (PL) header of a PL data frame, wherein the PL header comprises eight information bits $u_i$, (i=0, 1, 2, ..., 7), and the encoding is based on a convolutional code, whereby, for each information bit $u_i$, (i=0, 1, 2, ..., 7), ten associated parity bits $p_{i,k}$, (k=0, 1, 2, ..., 9) are generated, resulting in 80 codebits;
    a puncturing module configured to puncture the resulting 80 codebits to form an (8,64) physical layer signaling (PLS) codeword for transmission of the PL data frame over a channel of a communications network; and
    a parity bit generator configured to generate, for each information bit $u_i$, (i=0, 1, 2, ..., 7), ten associated parity bits $p_{i,k}$, (k=0, 1, 2, ..., 9), as follows:
    $p_{i,k}=(u_i*g_{k,0})\oplus(u_{i-1}*g_{k,1})\oplus(u_{i-2}*g_{k,2})\oplus(u_{i-3}*g_{k,3})\oplus(u_{i-4}*g_{k,4})$
    wherein generator polynomials for $g_k=(g_{k,0}, g_{k,1}, g_{k,2}, g_{k,3}, g_{k,4})$, are as follows:
    $g_0=(1, 1, 1, 1, 1)$
    $g_1=(1, 0, 1, 1, 1)$
    $g_2=(1, 1, 0, 0, 1)$
    $g_3=(1, 1, 0, 1, 1)$
    $g_4=(1, 1, 1, 0, 1)$
    $g_5=(1, 1, 0, 1, 1)$
    $g_6=(1, 0, 1, 1, 1)$
    $g_7=(1, 0, 1, 0, 1)$
    $g_8=(1, 0, 0, 1, 1)$
    $g_9=(1, 0, 0, 0, 1)$.

19. The apparatus of claim 18, wherein the puncturing of the resulting 80 codebits comprises puncturing the parity bits $p_{0,5}, p_{0,6}, p_{1,5}, p_{1,6}, p_{2,5}, p_{2,6}, p_{3,5}, p_{3,6}, p_{4,5}, p_{4,6}, p_{5,5}, p_{5,6}, p_{6,5}, p_{6,6}, p_{7,5}, p_{7,6}$ (the fourth and fifth parity bits for each of the information bits $u_0, u_1, u_2, ..., u_7$).

20. An apparatus comprising:
    an encoder configured to encode a physical layer (PL) header of a PL data frame, wherein the PL header comprises sixteen information bits $u_i$, (i=0, 1, 2, ..., 15), and the encoding is based on a convolutional code, whereby, for each information bit $u_i$, (i=0, 1, 2, ..., 15), five associated parity bits $p_{i,k}$, (k=0, 1, 2, 3, 4) are generated, resulting in 80 codebits;

a puncturing module configured to puncture the resulting 80 codebits to form a (16,77) codeword of 77 codebits $(c_0, c_1, c_2, \ldots, c_{76})$;

a repeater module configured to repeat the codebits of the (16,77) codeword to generate a (16,154) physical layer signaling (PLS) codeword $(c_0, c_0, c_1, c_1, c_2, c_2, \ldots, c_{76}, c_{76})$ for transmission of the PL data frame over a channel of a communications network; and a parity bit generator configured to generate, for each information bit $u_i$, (i=0, 1, 2, ..., 15), five associated parity bits $p_{i,k}$, (k=0, 1, 2, 3, 4), as follows:

$p_{i,k} = (u_i * g_{k,0}) \oplus (S_0 * g_{k,1}) \oplus (S_1 * g_{k,2}) \oplus (S_2 * g_{k,3}) \oplus (S_3 * g_{k,4})$ where $S_0 = u_{i-1}$, $S_1 = u_{i-2}$, $S_2 = u_{i-3}$, $S_3 = u_{i-4}$, and wherein generator polynomials for $g_k = (g_{k,0}, g_{k,1}, g_{k,2}, g_{k,3}, g_{k,4})$, are as follows:

$g_0 = (1, 0, 1, 0, 1)$
$g_1 = (1, 0, 1, 1, 1)$
$g_2 = (1, 1, 0, 1, 1)$
$g_3 = (1, 1, 1, 1, 1)$
$g_4 = (1, 1, 0, 0, 1)$.

21. The apparatus of claim 20, wherein the puncturing of the resulting 80 codebits comprises puncturing the parity bits $p_{3,4}$, $p_{8,4}$, $p_{13,4}$ (the third parity bit for each of the information bits $u_3$, $u_8$, $u_{13}$).

22. The apparatus of claim 20, wherein the apparatus further comprises:

a 2:1 multiplexer with a first input comprising the (16,77) codeword; and

N Exclusive OR components with a first input of each of the N Exclusive OR components being a respective one of N groups of consecutive codebits of the (16,77) codeword, each group being of an integer number of codebits approximately equal to 77/N, wherein N is equal to a number of additional information bits to be encoded;

wherein the repetition of the codebits of the (16,77) codeword comprises:

encoding the N additional information bits to generate a (16+N, 154) physical layer signaling (PLS) codeword for transmission of the PL data frame over a channel of a communications network;

wherein the encoding of the N additional information bits comprises inputting each of the N additional information bits into a second input of a respective one of the Exclusive OR components, and inputting the outputs of each of the Exclusive OR components into a second input of the 2:1 multiplexer, wherein, as the 2:1 multiplexer cycles through the insertion of the repeated bits, it switches through the bit group feeds from the Exclusive-OR components, and each group of codebits from the (16,77) codeword is repeated as is or repeated as an inverse, depending on the value of the additional information bit fed into the respective Exclusive-OR component.

* * * * *